United States Patent
Yamagata et al.

(10) Patent No.: US 6,410,436 B2
(45) Date of Patent: *Jun. 25, 2002

(54) METHOD OF CLEANING POROUS BODY, AND PROCESS FOR PRODUCING POROUS BODY, NON-POROUS FILM OR BONDED SUBSTRATE

(75) Inventors: Kenji Yamagata, Sagamihara; Satoshi Matsumura, Atsugi, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/526,541

(22) Filed: Mar. 16, 2000

(30) Foreign Application Priority Data

Mar. 26, 1999 (JP) ............................. 11-083599

(51) Int. Cl.[7] .................. H01L 21/302; H01L 21/46; H01L 21/461
(52) U.S. Cl. ............... 438/689; 438/455; 438/459; 438/691; 438/745; 438/753
(58) Field of Search .................. 438/689, 455, 438/457, 459, 691, 751, 745, 753; 134/2, 3, 1.2, 25.4, 30, 26, 28, 36, 37, 41, 902; 427/331, 372, 337, 374.6; 510/175

(56) References Cited

U.S. PATENT DOCUMENTS

| | | | |
|---|---|---|---|
| 3,898,351 A | 8/1975 | Kennison et al. ............. 427/57 |
| 4,543,130 A | 9/1985 | Schwartzman ................. 134/1 |
| 4,695,327 A | 9/1987 | Grebinski .................... 134/11 |
| 5,143,103 A | 9/1992 | Basso et al. ............... 134/98.1 |
| 5,250,460 A | 10/1993 | Yamagata et al. ............ 437/62 |
| 5,371,037 A | 12/1994 | Yonehara ..................... 437/86 |
| 5,458,755 A | 10/1995 | Fujiyama et al. ......... 204/224 R |
| 5,466,631 A | 11/1995 | Ichikawa ...................... 437/62 |
| 5,660,642 A | 8/1997 | Britten ......................... 134/30 |
| 5,750,000 A | 5/1998 | Yonehara et al. .......... 156/630.1 |
| 5,767,020 A | 6/1998 | Sakaguchi et al. ........... 438/705 |
| 5,868,866 A | 2/1999 | Maekawa et al. ............. 134/34 |
| 5,869,387 A | 2/1999 | Sato et al. .................. 438/459 |
| 5,980,633 A | * 11/1999 | Yamagata et al. ........... 438/459 |
| 6,058,945 A | * 5/2000 | Fujiyama et al. ............. 134/86 |
| 6,100,166 A | * 8/2000 | Sakaguchi et al. ........... 438/455 |
| 6,103,598 A | * 8/2000 | Yamagata et al. ........... 438/459 |
| 6,171,512 B1 | * 1/2001 | Sakaguchi et al. ............ 216/56 |
| 6,180,497 B1 | 1/2001 | Sato et al. .................. 438/458 |
| 6,199,563 B1 | 3/2001 | Uehara et al. | |

FOREIGN PATENT DOCUMENTS

| | | | | |
|---|---|---|---|---|
| EP | 0618624 A2 | 10/1994 | | |
| EP | 0810643 A2 | 12/1997 | | |
| EP | 860860 A2 | 8/1998 | | |
| EP | 1039517 A2 | * 9/2000 | ......... H01L/21/306 |
| JP | 60-094737 | 5/1985 | | |
| JP | 5-243203 | 9/1993 | | |
| JP | 6-216101 | 8/1994 | | |
| JP | 6-338631 | 12/1994 | | |
| JP | 8-241863 | 9/1996 | | |
| JP | 2608351 | 5/1997 | | |
| JP | 10-64870 | 3/1998 | | |

OTHER PUBLICATIONS

Patent Abstracts of Japan, vol. 1997, No. 1 corresponding to JP 08–241863, Jan. 31, 1997.

Kazuo Imai, "A New Dielectric Isolation Method Using Porous Silicon," *Solid State Electronics*, vol. 24(2), pp. 159–164 (1981).

* cited by examiner

Primary Examiner—Matthew Smith
Assistant Examiner—Igwe U. Anya
(74) Attorney, Agent, or Firm—Fitzpatrick, Cella, Harper & Scinto

(57) ABSTRACT

In order to clean a porous body in a short time without causing any change in its structure, the porous body is cleaned after the anodization is completed with a cleaning solution containing at least one of an alcohol and acetic acid.

63 Claims, 17 Drawing Sheets

EVAPORATION

METHOD OF CLEANING POROUS BODY, AND PROCESS FOR PRODUCING POROUS BODY, NON-POROUS FILM OR BONDED SUBSTRATE

BACKGROUND OF THE INVENTION

1. Field of the Invention

This invention relates to a method of cleaning a porous body, and a process for producing a porous body, a non-porous film or a bonded substrate. More particularly, this invention belongs to a technical field of a production process in which a method of cleaning a porous body after anodization can be improved to form a non-porous film having a uniform thickness.

2. Related Background Art

In the following description, porous silicon is used as an example of the porous body.

Porous silicon was discovered by A. Uhlir and D. R. Turner in the course of their research related to the electrolytic polishing of single-crystal silicon biased to positive potential, in an aqueous hydrogen fluoride (hereinafter often simply "HF") solution (i.e., hydrofluoric acid).

Since then, utilizing porous silicon's high reactivity, studies were conducted related to its application to the step of interelement isolation that requires formation of a thick insulating material in a silicon integrated-circuit fabrication process, and a technique of FIPOS (full isolation by porous oxidized silicon) has been developed in which device elements are full isolated by a porous silicon oxide film (K. Imai, Solid-state Electron 24, 159, 1981).

Recently, in, e.g., Japanese Patent No. 2608351 and U.S. Pat. No. 5,371,037, there was proposed a technique in which a silicon epitaxial layer grown on a porous silicon substrate is bonded to the surface of an amorphous substrate or single-crystal silicon substrate, optionally via an oxide film, to obtain an SOI (silicon on insulator) substrate.

Besides, Japanese Patent Application Laid-Open No. 6-338631 discloses a technique that uses porous silicon as a light-emitting material such as what is called a photoluminescent material or an electroluminescent material.

Anodization is commonly used to form porous bodies.

As an example of the formation of porous bodies, an apparatus for producing porous silicon by subjecting a silicon substrate to anodization is shown in FIG. 18.

The apparatus or unit shown in FIG. 18 is the one disclosed in Japanese Patent Application Laid-Open No. 60-94737. This anodization apparatus comprises anodization baths 61 and 62 made of an HF-resistant material TEFLON (a trademark of Du Pont, U.S.A.) which are so provided as to hold between them a silicon substrate W as a treatment target. The baths 61 and 62 are provided with a negative electrode 63 and a positive electrode 64, respectively. The baths 61 and 62 have grooves in the sidewalls coming into contact with the silicon substrate W. In these grooves, sealing members such as O-rings 65 and 66 made of fluorine rubber are respectively fitted. Thus, the baths 61 and 62 holding the silicon substrate W are sealed with the O-rings 65 and 66. The baths 61 and 62 sealed in this way are filled with aqueous HF solutions 67 and 68, respectively.

Other anodization apparatuses have also been proposed.

Meanwhile, with regard to methods of cleaning porous semiconductor substrates after the anodization has been effected, an example is reported in Japanese Patent Application Laid-Open No. 10-64870, but it appears that very few other examples have been reported.

For the cleaning of porous bodies structurally having a high surface activity, liquid chemicals that are commonly used to remove organic matter, particularly metal deposits, such as an aqueous solution of sulfuric acid and hydrogen peroxide (hereinafter "SPM"), an aqueous solution of ammonia and hydrogen peroxide (hereinafter "SC-1") and an aqueous solution of hydrochloric acid and hydrogen peroxide (hereinafter "SC-2"), cannot be used. Accordingly, a cleaning method has been proposed in which pure water is used with ultrasonic energy instead of the liquid chemicals to remove foreign matter adhering to porous layer surfaces, as disclosed in Japanese Patent Application Laid-Open No. 10-64870. FIG. 19 is a flow chart of the steps of such a cleaning method. A porous body, after it has been anodized in step STP1, is cleaned in step STP2 with pure water and ultrasonic energy, followed by drying in step STP3.

The above publication also discloses a method in which the porous layer surface is hydrophilicly treated with ozone water or hydrogen peroxide water and thereafter cleaned with pure water and ultrasonic energy.

However, while in cleaning porous semiconductors cleaning the surfaces is crucial, it is also important to remove the anodizing electrolytic solution that entered the fine the pores. This is because, even though the surface has been cleaned, the electrolytic solution (usually an aqueous HF solution with a concentration of 10% by weight to 50% by weight) remaining in the pores causes a change in structure of the porous body.

In addition, the HF that vaporizes gradually as HF gas from the interior of the pores may corrode the surrounding devices. Moreover, particles generated as a result of corrosion may contaminate the substrate.

Furthermore, since it takes time to replace the HF in the pores with pure water, cleaning with pure water must be carried out for a long time. In such a case, the porous body maybe crushed in pure water to generate a large quantity particles.

Such porous bodies are also preferably used in the production of bonded substrates utilized in SOI techniques.

FIG. 20 is a diagrammatic view to illustrate a process of producing a bonded substrate.

First, in step S1, a non-porous substrate 1 such as a single-crystal silicon wafer is prepared and its surface is made porous by anodization to form a porous layer 2 formed of single-crystal silicon.

Next, in step S2, the porous layer 2 is cleaned with pure water to wash away the foreign matter adhering to the porous layer or the electrolytic solution for anodization.

Subsequently, in step S3, a non-porous layer 3 formed of single-crystal silicon is epitaxially grown on the porous layer 2 by, e.g., CVD (chemical vapor deposition).

Then, in step S4, the surface of the non-porous layer is thermally oxidized to form an insulating layer 4.

In a subsequent step S5, the surface of the insulating layer 4 is bonded to a supporting base 5 prepared separately, to from a multi-layered structure in which the non-porous layer 4 is positioned inside.

In step S6, the non-porous portion of the substrate 1 is removed by grinding and by ion etching subsequent thereto.

Then, in step S7, the porous layer 2 thus uncovered is removed by etching with an aqueous solution containing HF and $H_2O_2$.

The surface of the non-porous semiconductor layer may optionally be smoothed by heat treatment in a reducing atmosphere containing hydrogen. Thus, a bonded substrate is obtained that has a thin semiconductor layer on an insulating layer formed on a supporting base. FIG. 21 illustrates the top surface of a bonded substrate obtained in this fashion. Reference numeral 12 denotes a notch.

However, upon observing the surface of the non-porous semiconductor layer thus formed, few circular spots 11 (hazes) that look optically different from their surrounding area are often seen. As a result of a careful observation of the circular spots 11, it has been found that these spots are due to the fact that the non-porous layer present on the insulating layer formed on the supporting base is locally thin. Namely, the non-porous layer proved to have locally caused microscopically uneven film thickness.

SUMMARY OF THE INVENTION

An object of the present invention is to provide a porous-body cleaning method by which the anodizing solution can be removed from the porous body without causing any change in porous structure of the porous body, even when cleaned for a short time, and to provide a process for producing a porous body.

Another object of the present invention is to provide a porous-body cleaning method that may hardly cause any corrosion of the surrounding devices, and a process for producing a porous body.

The cleaning method of the present invention is directed to cleaning a porous body formed by anodization, and is characterized by comprising the step of cleaning the porous body after the anodization is completed, with a cleaning solution containing at least one of an alcohol and acetic acid.

The porous-body production process of the present invention is characterized by comprising the step of subjecting a non-porous body to anodization and thereafter cleaning a porous body with a cleaning solution containing at least one of an alcohol and acetic acid.

Still another object of the present invention is to provide a process for producing a non-porous film and a bonded substrate that are free of uneven film thickness.

The above process of the present invention is characterized by a process for producing a non-porous film or a bonded substrate, the process comprising the steps of forming a porous layer by anodization, bonding to a supporting base a non-porous layer formed on the porous layer, and removing the porous layer, wherein the process further comprises the step of, after the anodization is completed, cleaning the porous layer with a cleaning solution containing at least one of an alcohol and acetic acid.

At first, the present inventors had thought that the haze described above occurs because of the conditions at the time of anodization or etching conditions that are not optimized when the porous layer is removed from the surface of the non-porous layer. However, any adjustment of these conditions was found not to affect substantially the uneven film thickness. Then, further studies made by the present inventors have revealed that the uneven film thickness is related to the treatment made after anodization.

Accordingly, in the present invention, the above cleaning method is employed in wet cleaning after anodization so that the non-porous layer of the bonded substrate may hardly cause uneven film thickness.

DESCRIPTION OF THE PREFERRED EMBODIMENTS

Figure 1:
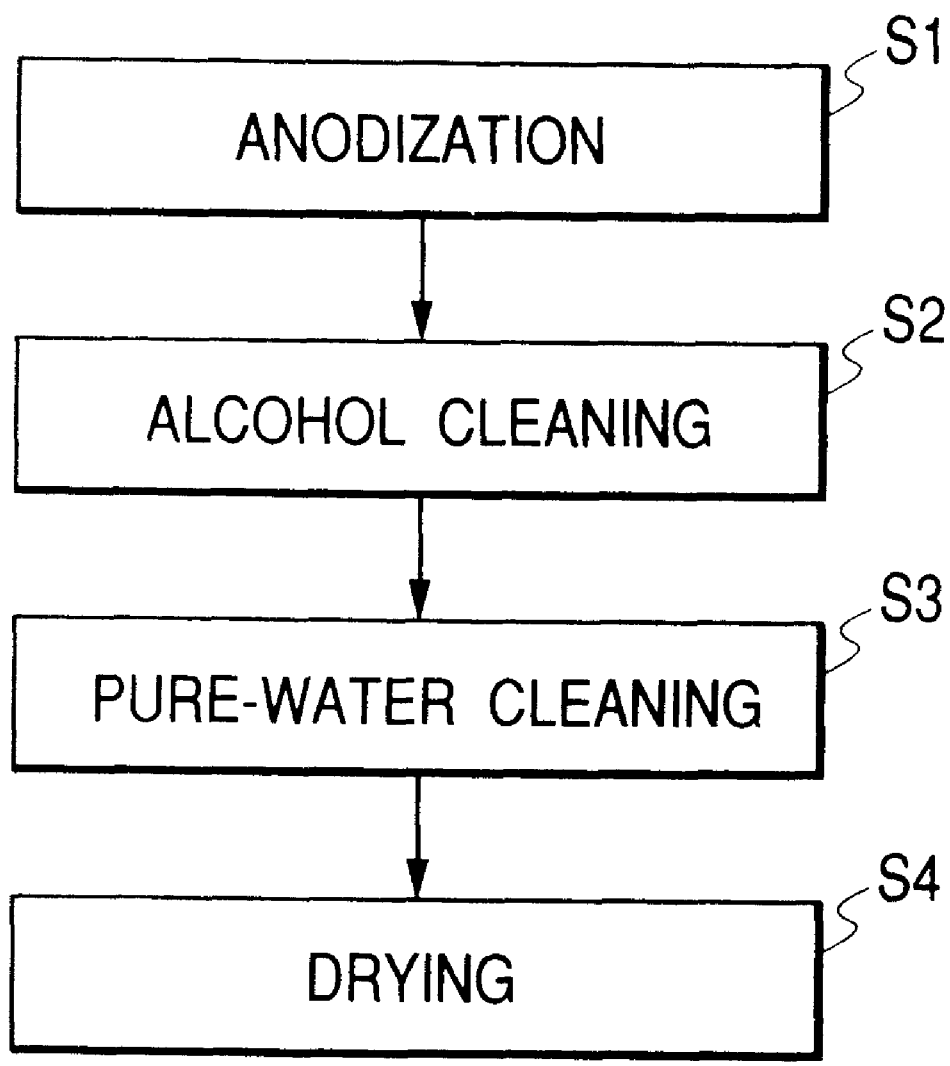
FIG. 1 is a flow chart of the steps of cleaning a porous body according to the present invention.

FIG. 1 is a flow chart of the cleaning method of the present invention.

First, in step S1, a non-porous body is anodized to form a porous body. ("Porous body" as used herein is meant to embrace a material that is porous on the whole and a material having a porous layer described later.)

Subsequently, in step S2, the porous body is cleaned by immersing it in a 100% alcohol or an aqueous alcohol solution, by adding a 100% alcohol or an aqueous alcohol solution drop-wise to the porous body, or by exposing the porous body to the vapor of a 100% alcohol or an aqueous alcohol solution.

Next, optionally, in step S3, the porous body is cleaned with pure water. In this step, too, the porous body may be immersed in pure water, which may be added drop-wise to the porous body, or the porous body may be exposed to water vapor (steam). Here, it is also preferable to clean it with pure water provided with ultrasonic energy by the use of an ultrasonic vibrator.

Then, in step S4, the porous body is dried to complete a series of cleaning steps.

Usually, in the case where semiconductors such as silicon are subjected to anodization to form porous bodies, the anodization is effected by applying an electric field to the silicon substrate in an aqueous HF solution having a relatively high concentration. The silicon surface opposing the negative electrode (this silicon surface serves substantially as the anode) is so etched that fine pores extending along the direction of the electric field are formed, so that it comes to have a porous structure.

The pores thus formed have a size distribution from tens of nanometers to hundreds of nanometers, and have a density reaching $10^{11}$ pores/cm$^2$ or higher. The size and density of the pores change depending on the conditions of anodization, i.e., HF concentration, values of anodization voltage or anodization electric current, and conductivity type or specific resistance of the substrate. Their porosity may be controlled by adjusting these conditions, whereby structures most suited for light-emitting materials or porous bodies most suited for base structures for epitaxial growth can be produced with relative ease.

However, even porous bodies obtained exactly as designed may cause a structural change of porous layers or may be involved in secondary contamination, unless they are sufficiently cleaned after anodization. FIGS. 2 to 5 are diagrammatic views illustrating how the interior of the pores of the porous body stands.

Figure 2:
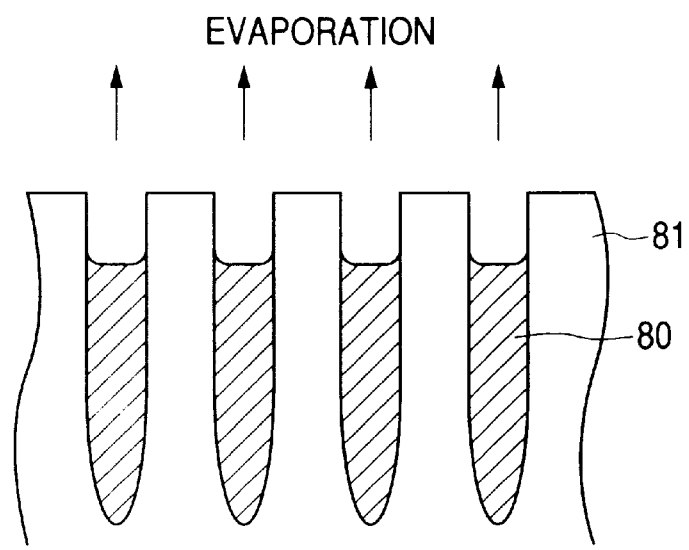
FIG. 2 is a diagrammatic cross-sectional view of a porous body standing immediately after anodization.

Such structural change and secondary contamination are caused by, as shown in FIG. 2, an aqueous HF solution 80 remaining in the pores as stated previously and evaporating gradually in the form of a gas. Accordingly, a cleaning method is necessary that does not allow any anodizing solution such as an aqueous HF solution 80, to remain in the pores. Reference numeral 81 denotes pore walls of the porous body.

Figure 3:
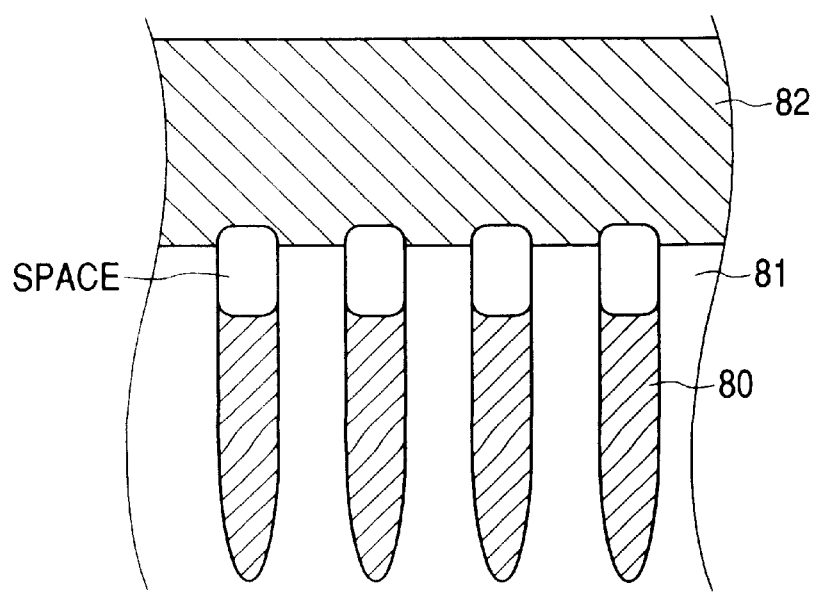
FIG. 3 is a diagrammatic cross-sectional view of a porous body after the porous body standing as shown in FIG. 2 has been cleaned with pure water immediately after anodization.

If the substrate is only cleaned with pure water after the anodization is completed, although the HF component on the layer surface of the porous layer may be removable, it is difficult to remove the HF remaining in the pores. This is because, as shown in FIG. 3, the layer surface of the porous layer becomes hydrophobic as a result of its contact with the aqueous HF solution 82, and, even though it is washed with water thereafter, the water has difficulties penetrating into the pores. Specifically, in measuring the changes with time of specific resistance of the pure water in which the porous body, having been subjected to anodization stand, is immersed, it was observed that specific resistance does not return to the original value. This is because the HF that gradually vaporized from the pores dissolves in pure water at a low rate.

In order to clean the interior of the pores, it is also necessary at least to replace the anodizing solution in the bath with pure water within 3 minutes after the anodization is completed, and to rinse sufficiently with pure water. Such a procedure, however, limits the freedom of the cleaning process and restricts the possible designs of the cleaning unit.

The present inventors repeated various experiments. As a result, they have discovered that cleaning with pure water to which a 100% alcohol or an aqueous alcohol solution has been added, readily enables replacement of the anodizing solution in the pores with the cleaning solution.

Figure 4:
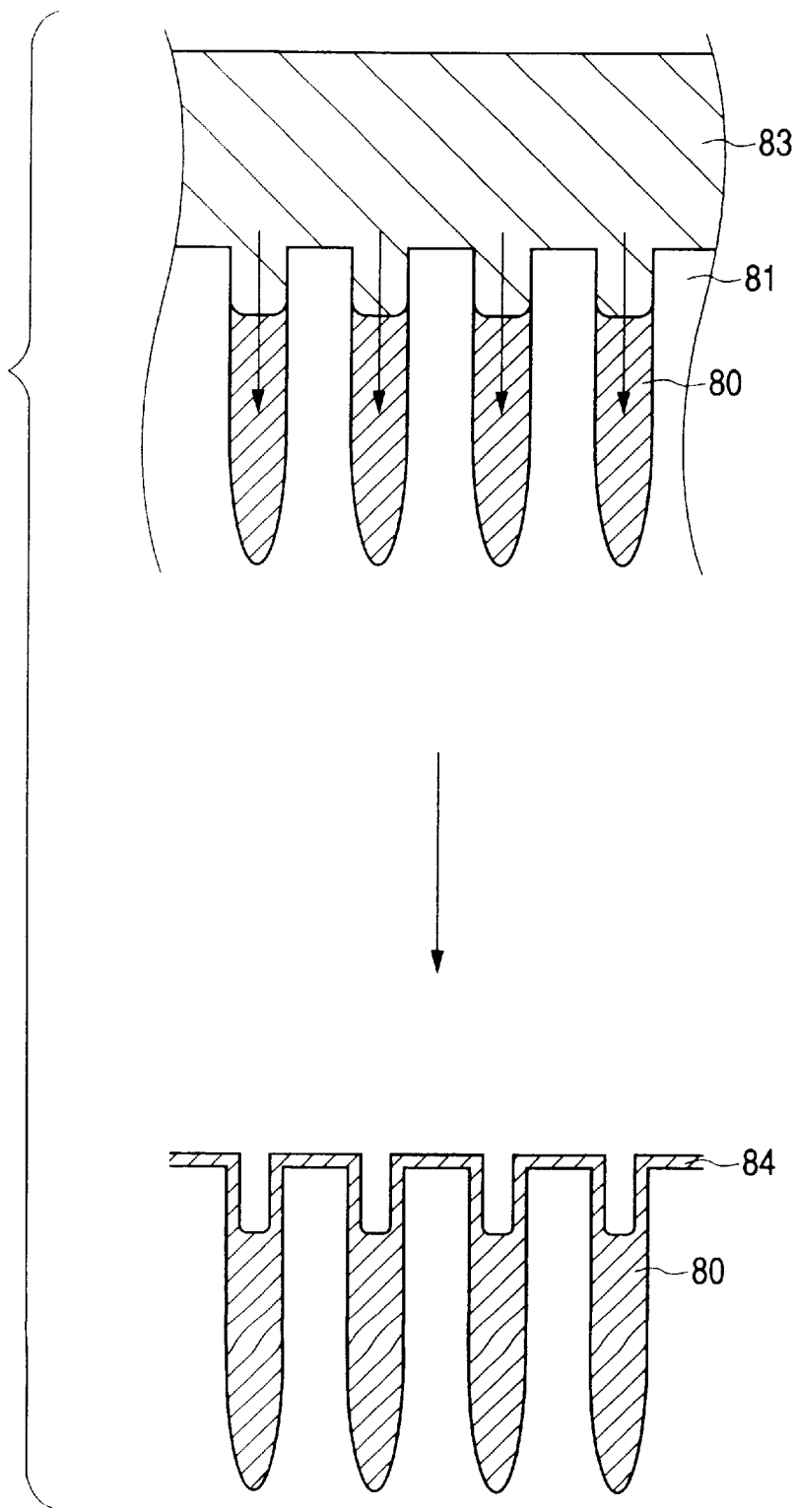
FIG. 4 is a diagrammatic view to illustrate the action of cleaning with an alcohol according to the present invention.
Figure 5:
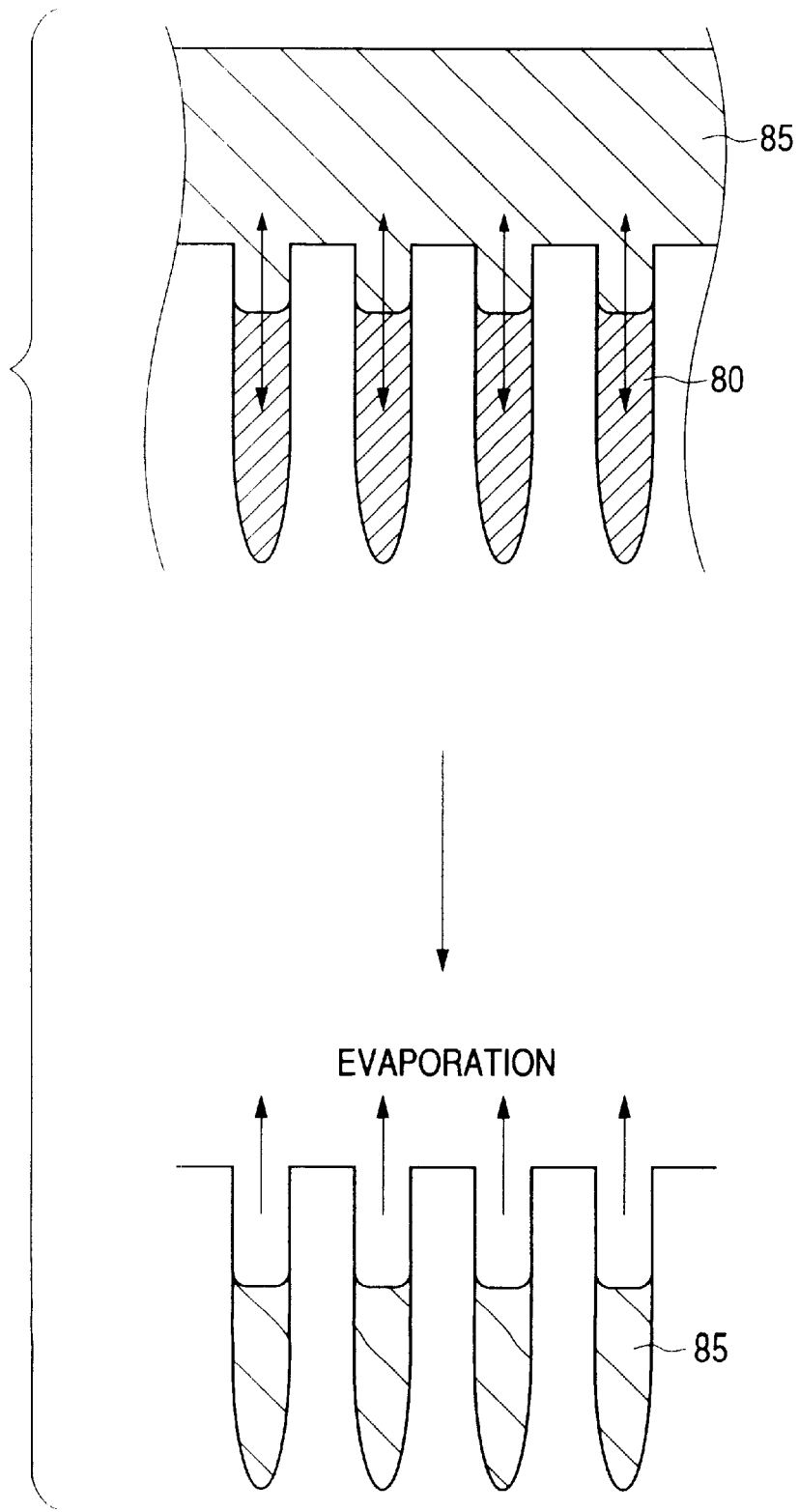
FIG. 5 is a diagrammatic view to illustrate the action of cleaning with pure water, used in the present invention.

Once the porous body is immersed in the cleaning solution containing an alcohol, as shown in FIG. 4, the cleaning solution 83 penetrates into fine pores mixing with the anodizing solution remaining in the pores. Then, even when the porous body is exposed to the atmosphere as it is, its surface is kept wet for a while. More specifically, the surface of the porous body is covered with a layer 84 formed of the cleaning solution or anodizing solution. This porous body is immersed in pure water 85 as shown in FIG. 5, so that the water 85 penetrates into the pores with ease, thus the anodizing solution 80 remaining therein can be replaced with the pure water 85.

After that, even if the pure water 85 has remained in the pores of the porous body, the water evaporates naturally. Hence, because only water vapor is released, there is little corrosion of surrounding devices or the change of properties or deterioration of the porous body's structure itself.

The porous bodies used in the present invention may include semiconductors such as Si, Ge, GaAs, GaAlAs, SiC, SiGe and C. In particular, porous silicon having a porosity lower than 70% is preferred as a base material for epitaxial growth, and silicon having a porosity of 70% or higher as a light-emitting material.

The anodization used in the present invention is carried out in an aqueous HF solution, or an aqueous solution of HF and an alcohol.

Alcohol such as methanol, ethanol and propanol can be used in the cleaning step of the present invention. The cleaning solution may be any those containing at least 4% by weight, and preferably at least 10% by weight, of an alcohol.

After cleaning with the cleaning solution containing an alcohol, the porous body may preferably be cleaned (or rinsed) with pure water. Here, as mentioned previously, it may be cleaned with pure water together with ultrasonic energy, which may be within the range of 600 KHz to 2 MHz. This can further improve the efficiency of the replacement of HF with water.

In the case of the present invention, after the anodization is completed, the porous body may preferably be moved from the anodizing solution to the cleaning solution a shortest possible time, which, however, is by no means limited to 3 minutes, and may be prolonged up to about 10 minutes.

A cleaning unit (an anodization-and-cleaning unit) used in the present invention will be described below with reference to FIG. 6.

Figure 6:
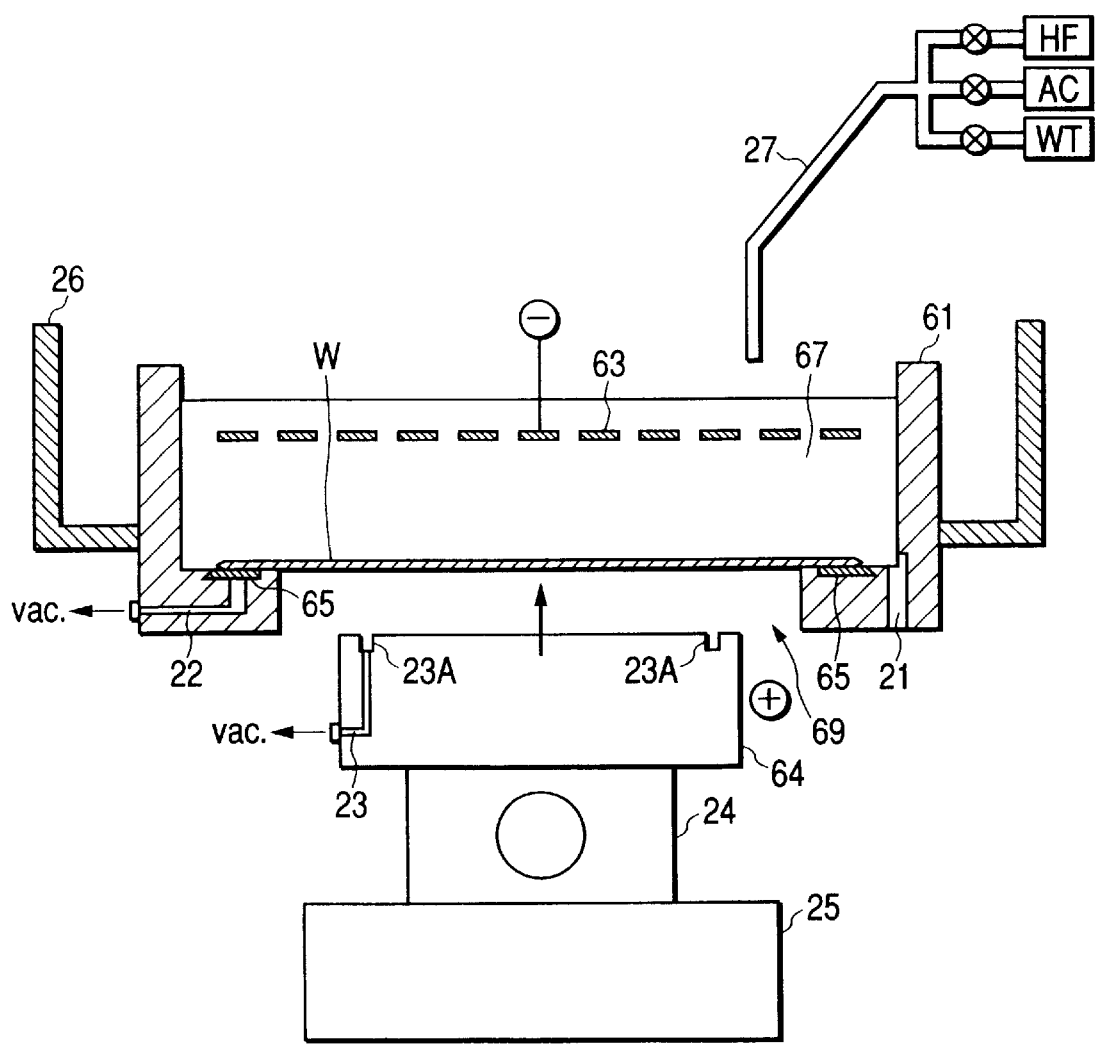
FIG. 6 is a diagrammatic view showing an anodization-and-cleaning unit used in the present invention.

The cleaning unit shown in FIG. 6 is constructed so as to also serve as an anodization unit. This unit is constructed so as to consist primarily of a bath 61 that also functions as a substrate holder and can hold the anodizing solution and the cleaning solution, a flat-plate negative electrode 63 provided with many holes, and a positive electrode 64 that can be moved up and down relative to the bath 61. The bath 61 is made of a fluorocarbon type fluorine-resistant material such as a tetrafluoroethylene resin, and has an opening 69 at the bottom of the bath 61. Then, along the inside edge of this opening 69, a sealing member 65 such as a substrate suction ring is set to the bottom of the bath 61. The substrate attraction (suction) ring 65 is flat at its attraction portion, and in its plane a vacuum groove (not shown) is formed, which communicates with a communicating path 22 for evacuating/pressurizing its space to vacuum-attract or pressurize-release a treatment target W. The treatment target W, such as a silicone wafer, is attracted and held to the substrate suction ring 65 at its under-side perimeter. In this state, an electrolytic solution is poured as an anodizing solution 67 into the bath 61 from a feed nozzle 27 until the negative electrode 63 stands immersed in the electrolytic solution. The negative electrode 63 is made of a platinum plate having substantially the same diameter as the treatment target, and a plurality of holes like those made by punching are made in the plate, so that reaction by-product gases such as hydrogen generated during the anodization can be removed. The positive electrode 64 passes through the opening 69 of the bath 61 to come into direct contact with the back of the treatment target W. This positive electrode 64 does not come into direct contact with the electrolytic solution, and hence is formed of aluminum. The positive electrode 64 is placed on a stand 25 together with an up-and-down means 24, and is provided with a communicating path 23 for evacuating/pressurizing its space to vacuum-attract or pressurize-release the treatment target W.

To carry out anodization, the positive electrode 64 is raised to the uppermost position by the up-and-down means 24, and the treatment target W is placed thereon. The communicating path 23 is evacuated to attract the treatment target W to the positive electrode 64 by suction. The positive electrode 64 is descended to bring the treatment target W into contact with the bottom of the bath 61. Then, the communicating path 22 is evacuated to attract the treatment target W, at its perimeter, to the sealing member 6 by suction. After anodization is ready, the aqueous HF solution is fed into the bath 61 through the feed nozzle 27. After it has reached a predetermined quantity, a direct-current voltage is applied across the negative electrode 63 and the positive electrode 64. At this time, the anodization may be continued while feeding the aqueous HF solution continuously and allowing it to overflow. In FIG. 6, reference numeral 26 denotes an overflow bath.

After the anodization is completed, the positive electrode 64 is descended and the negative electrode 63 is brought outside the bath 61. A drain 21 is opened, and the anodizing solution, 67, is discharged therethrough to empty the bath 61. Thereafter, the cleaning solution containing an alcohol is fed through the feed nozzle. At this time, the cleaning may be carried out while allowing the cleaning solution to overflow too. The cleaning solution feed nozzle may be provided independently from the HF solution feed nozzle.

Subsequently, the drain 21 is again opened to discharge the cleaning solution containing an alcohol, and thereafter the pure water is fed into the bath 61 through the feed nozzle 27. It is preferable to optionally attach an ultrasonic vibrator to the feed nozzle 27 or bath 61, so that the pure water cleaning solution can be provided with ultrasonic energy.

After the cleaning with pure water, the drain 21 is opened to discharge the pure water. The vacuum attraction through the communicating path 22 is stopped, and the positive electrode 64 is ascended, where the vacuum attraction through the communicating path 23 is stopped to take out the treatment target W.

FIG. 6 illustrates a state where the positive electrode 64 is at the descended position, so as to make it easy to understand the construction of the unit. During the anodization, it is at the position coming into contact with the back of the treatment target W.

Figure 7:
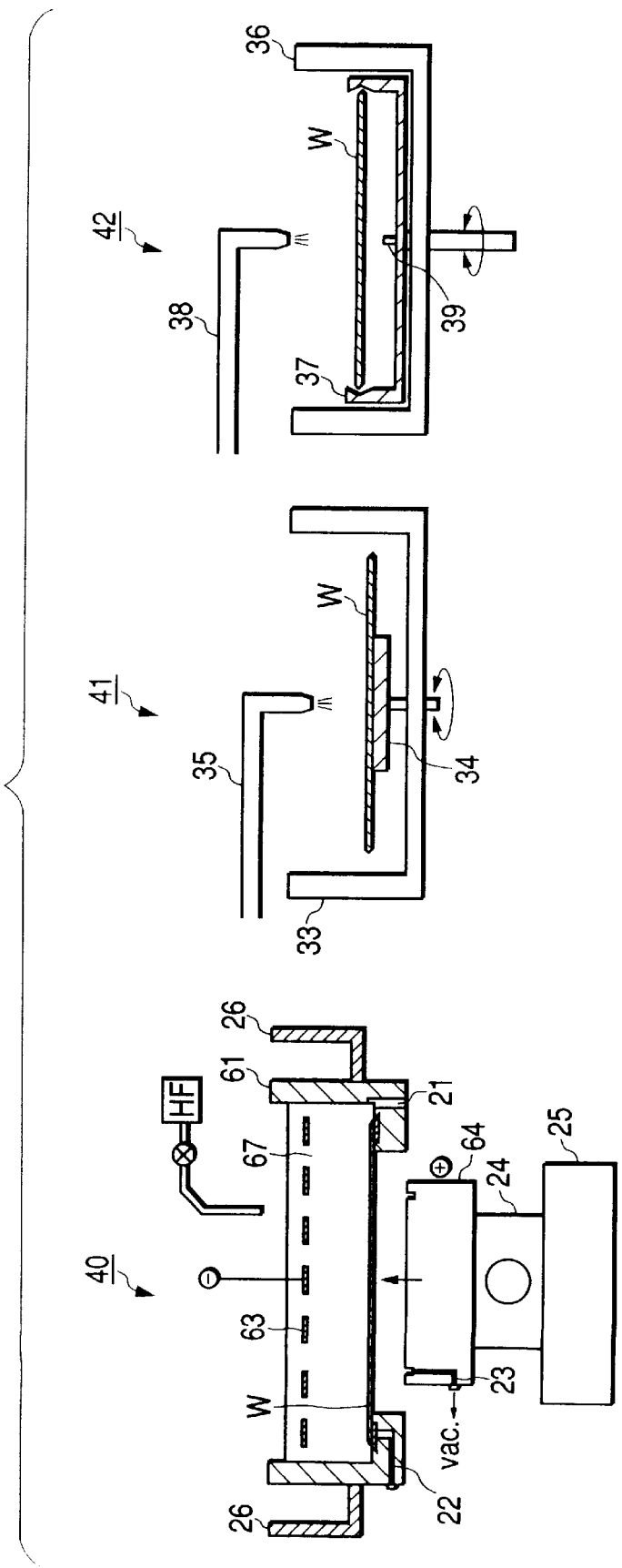
FIG. 7 is a diagrammatic view showing a system having an anodization unit and a cleaning unit separately, used in the present invention as another type.

FIG. 7 shows a porous-body cleaning system as another example used in the present invention.

The system shown in FIG. 7 has an anodization unit 40 having substantially the same construction as the one shown in FIG. 6, an alcohol cleaning unit 41 and a pure-water cleaning unit 42.

After the anodization is carried out in the anodization unit 40, the treatment target W having been anodized, after the anodizing solution in the bath 61 is completely discharged, is moved to the alcohol cleaning unit 41 by of a horizontal transfer robot (not shown). In an alcohol cleaning bath 33, a rotary chuck holder 34 vacuum-attracts the treatment target W on its back to hold it. In that state, the cleaning solution containing an alcohol is fed through a nozzle 35 provided above the treatment target W. In this unit, the cleaning solution containing an alcohol is jetted out toward the treatment target W while rotating it at a predetermined number of revolutions. Thus, the cleaning with an alcohol is effected.

Next, the treatment target W, on which the cleaning with an alcohol has been completed, is moved to the pure-water cleaning unit 42 by a horizontal transfer robot. The treatment target W is arranged so as to be held at its peripheral edge with a substrate chuck 37 tightly by an external force. Then, the pure water is fed through an upper nozzle 38 and a lower nozzle 39. In this unit, too, the pure water is jetted out of both the upper nozzle 38 and the lower nozzle 39 while rotating the treatment target W at a predetermined number of revolutions. Stopping the jetting of pure water, the treatment target W may further be spin-dried while continuing its rotation.

Figure 8:
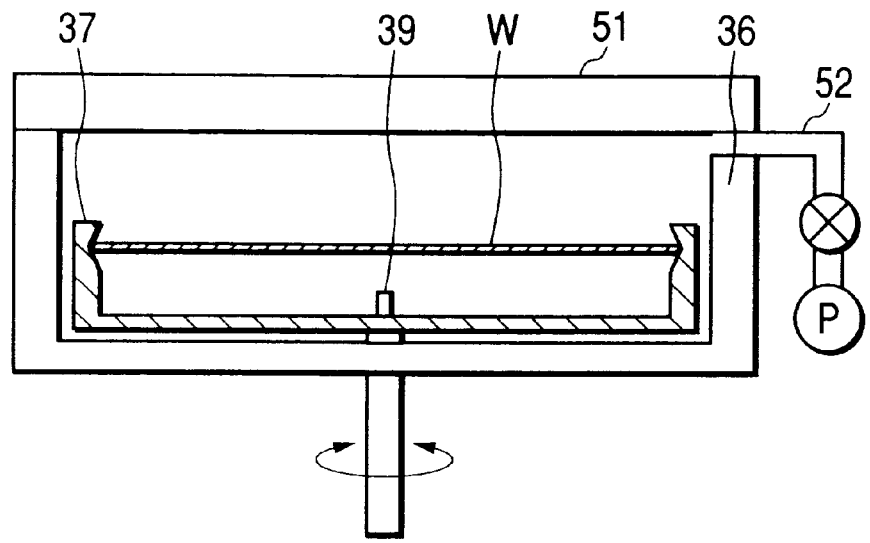
FIG. 8 is a diagrammatic view showing a cleaning-and-drying unit used in the present invention as another type.

FIG. 8 shows a pure-water cleaning unit used in the present invention. This unit is a modification of the pure-water cleaning unit 42 shown in FIG. 7, and is a unit having a bath 36 provided with a hermetically closable cover 51 so that, after rinsing with pure water, the hermetically closed space defined by the bath 36 and the cover 51 can be evacuated through an exhaust path 52 to carry out spin-drying while evacuating the hermetically closed space. Where water content remains in the pores, it may adversely affect the subsequent processing steps. For example, when epitaxial growth is effected on the porous silicon, a trace quantity of water may evaporate from the interior of the pores of the porous body and diffuse into an epitaxial growth chamber to bring about defects in an epitaxially grown film. In order to prevent this, it is fairly effective to complete such vacuum deaeration.

Figure 9:
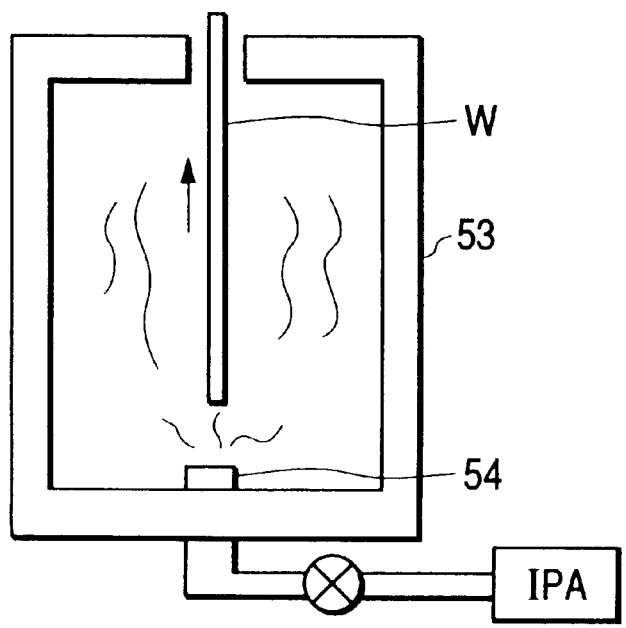
FIG. 9 is a diagrammatic view showing a cleaning-and-drying unit used in the present invention as still another type.

FIG. 9 shows an alcohol cleaning unit used in the present invention. A cleaning bath 53 is provided therein with a nozzle 54 through which the vapor of the cleaning solution containing an alcohol is fed. A treatment target W is inserted from above the bath 53 into it, and the vapor of the cleaning solution containing an alcohol is fed through the nozzle 54 to fill the inside of the bath with vapor to carry out the cleaning. Thereafter, the treatment target W may slowly be taken out of the bath to the external dry atmosphere, so that the alcohol remaining in the treatment target W evaporates, thus the treatment target W can be dried. If the pure water is directly jetted onto the porous body having a very high porosity, e.g., a porosity of 70% or higher, or ultrasonic water is imparted thereto to carry out physical cleaning, the porous body tends to crush. Accordingly, such a unit may be used, whereby even a porous body having a high porosity can be cleaned without breaking the porous body. Porous silicon having a porosity of 70% or higher is preferably applied as a light-emitting material. Compared with the conventional case where treatment targets are cleaned with only pure water after anodization, those subjected to cleaning with alcohol vapor and drying after anodization may cause no change in the porous structure. Hence, the material can maintain light-emission intensity with stability and for a long time.

In the foregoing, described is a case where a solution containing an alcohol is used as the cleaning solution. In the present invention, however, acetic acid may also be used instead of the alcohol.

A process for producing a non-porous film and a process for producing a bonded substrate according to the present invention will be described below.

Figure 10:
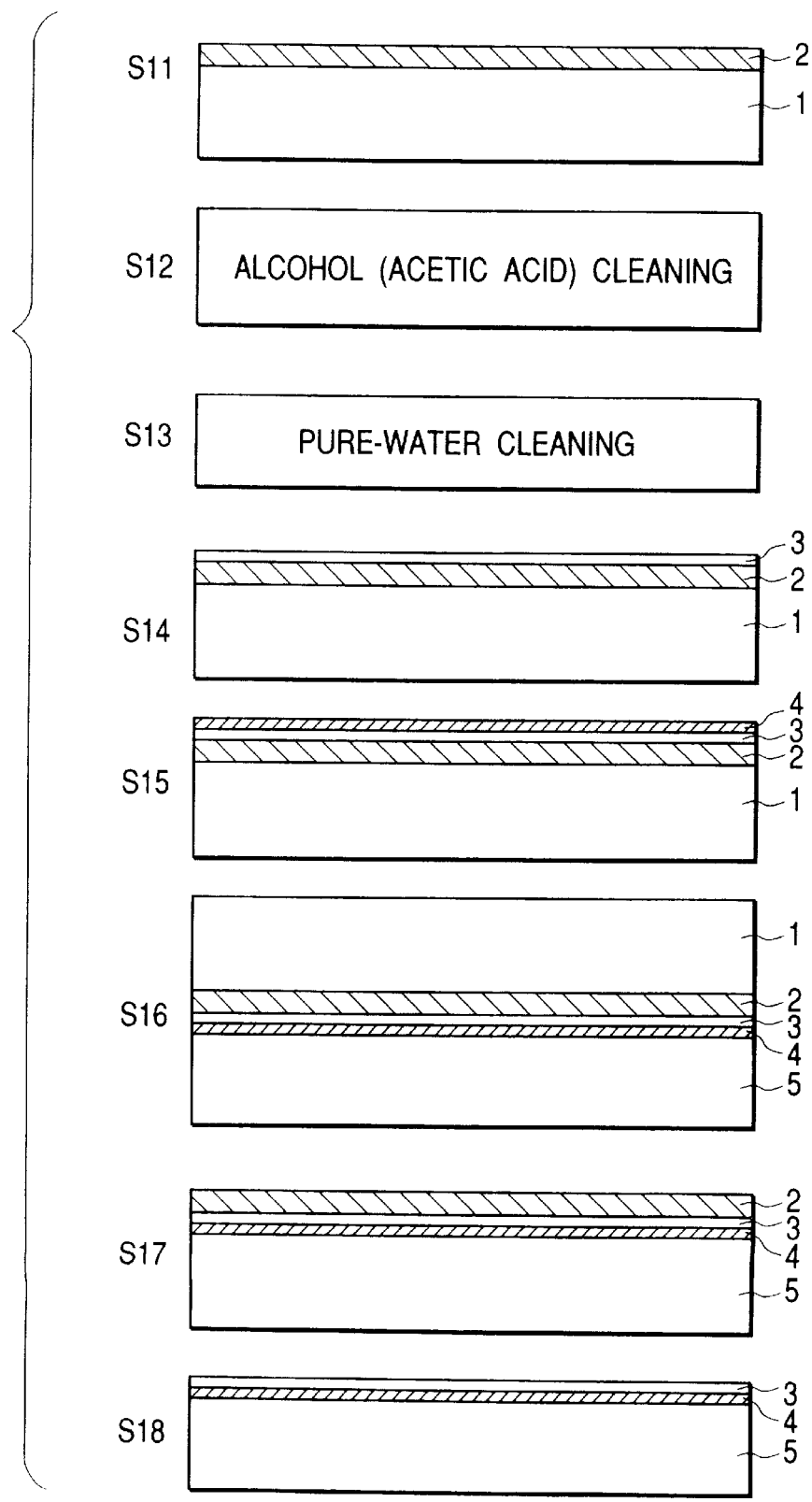
FIG. 10 is a flow chart of a process for producing a bonded substrate according to the present invention.

FIG. 10 is a flow chart of a process for producing a bonded substrate according to the present invention.

First, in step S11, a non-porous body 1 is treated by anodization to form a porous layer at least on its surface.

In step S12, the porous layer 2 is cleaned by being immersed in a 100% alcohol or an aqueous alcohol solution, by adding a 100% alcohol or an aqueous alcohol solution drop-wise to the porous layer 2, or by exposing the porous layer 2 to the vapor of a 100% alcohol or an aqueous alcohol solution. In this step S12, acetic acid may also be used instead of the alcohol. An example of the cleaning method is as described above.

Next, optionally, in step S13, the porous layer 2 is cleaned with pure water. In this step, too, the porous layer 2 may be immersed in the pure water, the pure water may be added drop-wise to the porous layer 2, or the porous layer 2 may be exposed to water vapor (steam). Here, it is also preferable to clean with pure water provided with ultrasonic energy by an ultrasonic vibrator. Then, the porous layer 2 is dried to complete a series of cleaning steps. Examples of washing with pure water and drying are also as described above.

Next, the porous layer 2 is oxidized at a low temperature to form a thin oxide layer on inner wall surfaces of the pores.

Subsequently, in step S14, a non-porous layer 3 is formed on the porous layer 2. Step S14 may be effected prior to step S11 to form the non-porous layer 3 on the non-porous body 1 and thereafter make the whole single-crystal silicon porous from the back. Alternatively, anodization may be carried out so that the back side of the non-porous body 1 is made porous to leave the non-porous layer 3 on the surface side.

Next, in step S15, an insulating layer 4 is optionally formed on the surface of the non-porous layer 3 and, as shown in step S16, the non-porous layer 3 is bonded to a supporting base 5 prepared separately, via the insulating layer 4 between them.

In step S17, pretreatment carried out to remove the porous layer 2 from the multi-layer structure thus formed. In the case where the non-porous body 1 remains as shown in FIG. 10, it is removed from the multi-layer structure by grinding, lapping, polishing or etching. Thereafter, the uncovered porous layer 2 is selectively removed as shown in step S18, by wet etching with an etchant containing HF, $H_2O_2$ and water.

Alternatively, the non-porous body 1 may be separated (step S17) by applying an external force to the multi-layer structure, or by producing an internal stress therein, so as to cause a break in the porous layer 2 or at its interface with the upper or lower layer. Some porous layer 2 remaining on the non-porous layer 3 may be selectively removed (step S18) by etching in the same manner as above.

The bonded substrate thus obtained may further optionally be subjected to a heat treatment in a reducing atmosphere containing hydrogen, to make its surface more smooth.

Since the porous layer can be almost free from any change in the porous structure due to HF or an aqueous HF solution remaining therein, the bonded substrate thus obtained does not cause any microscopically uneven film thickness, thus a bonded substrate having a high quality level can be obtained.

The porous layer 2 used in the present invention may include layers of, as stated previously, semiconductors such as Si, Ge, GaAs, GaAlAs, SiC, SiGe and C. In particular, porous silicon having a porosity lower than 70% is preferred as a base material used for epitaxial growth. More preferably, the porous layer at its part adjoining or adjacent to the non-porous layer may have a porosity not higher than 30%. The porous layer may preferably have a thickness of from about 1 $\mu$m to about 30 $\mu$m.

The anodization used in the present invention is carried out in an aqueous HF solution, or an aqueous solution of HF and an alcohol.

As the alcohol used in the cleaning step of the present invention, usable are methanol, ethanol and propanol. The cleaning solution may be any those containing at least 4% by weight of the alcohol.

After cleaning with the cleaning solution containing an alcohol, the porous body may preferably be cleaned with pure water. Here, as stated previously, it may be cleaned with pure water provided with ultrasonic energy ranging from 600 KHz to 2 MHz. This can further improve the efficiency of replacement of HF with water.

In the present invention, after the anodization is completed, the porous body may preferably be moved from the anodizing solution to the cleaning solution in a shortest possible time, which, however, is by no means limited to 3 minutes, and may be up to about 10 minutes.

The non-porous layer used in the present invention may preferably include, e.g., layers of elemental semiconductors such as Si and Ge, compound semiconductors such as GaAs, GaAlAs, SiC and SiGe, metals, and superconductors. Specifically, single-crystal silicon layers, polycrystalline silicon layers and amorphous silicon layers are preferred. In the non-porous layer, device or semiconductor junction such as MOSFET, p-n junction, p-i-n junction and MIS junction may also be formed.

As the optional insulating layer, preferably usable are layers of insulators or dielectrics, such as silicon oxide, silicon nitride and silicon oxide nitride. This layer may be formed as a single layer or a plurality of layers formed of like materials or different materials.

The supporting base used in the present invention may include semiconductors such as silicon, metals such as aluminum or stainless steel, ceramics such as alumina, and insulating materials such as quartz glass and plastic films. These supporting bases may also be those on the surface of which a layer of a material different from the material constituting the supporting base itself has been formed. In the case where bonded SOI substrates are produced, the insulating layer may preferably be formed on the surface of the non-porous layer and thereafter bonded to a silicon wafer or a quartz wafer. Also, the supporting base may be a jig used only for the separation.

In order to remove the porous layer selectively, an etchant is used which may achieve an etching rate of porous bodies that is at least 10,000 times, and preferably at least 100,000 times, the etching rate of non-porous bodies. In the case of porous silicon and non-porous silicon, solutions containing HF and an oxidant, as exemplified by a mixture solution of hydrofluoric acid, nitric acid and acetic acid, a mixture solution of hydrofluoric acid, hydrogen peroxide water and water, a mixture solution of hydrofluoric acid, an alcohol and water, and a mixture solution of hydrofluoric acid, hydrogen peroxide water and alcohol are preferred.

Anodization and Cleaning Units

In the present invention, the units shown in FIGS. 6 to 9 may be used as the anodization and cleaning unit. Anodization and cleaning units shown in FIGS. 11 to 14 may also be used.

Figure 11:
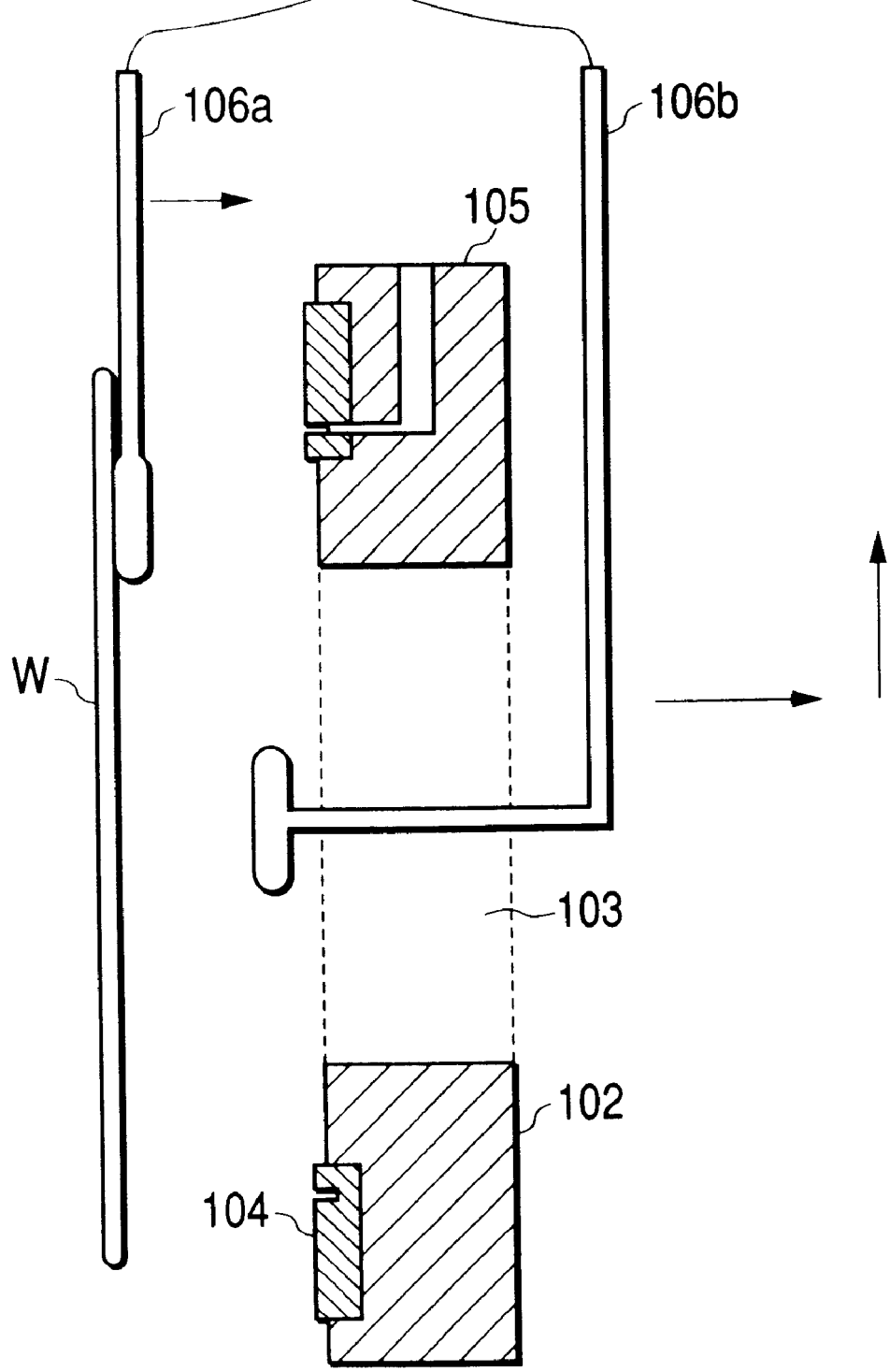
FIG. 11 is a diagrammatic view showing a part of an anodization unit used in the present invention.
Figure 12:
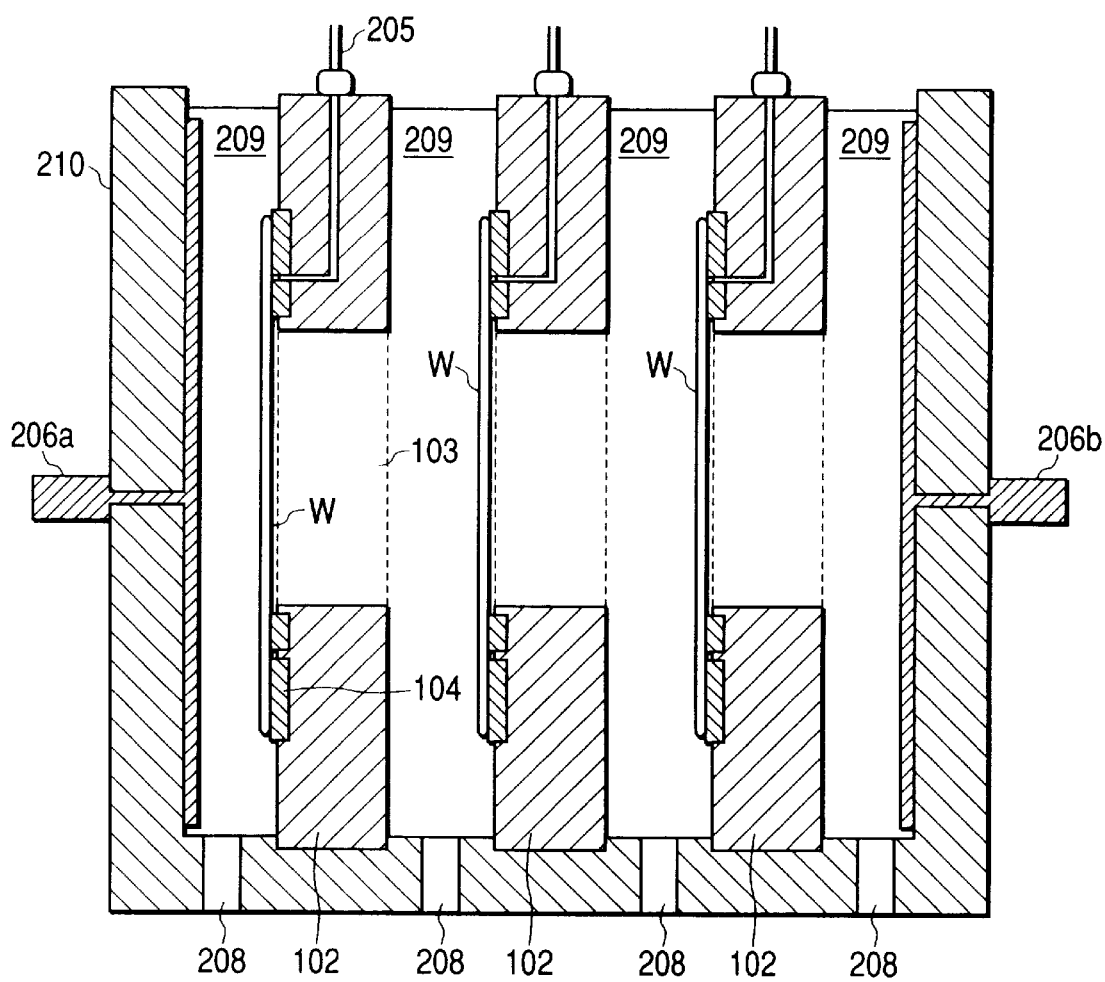
FIG. 12 is a diagrammatic view showing an anodization unit used in the present invention.
Figure 13:
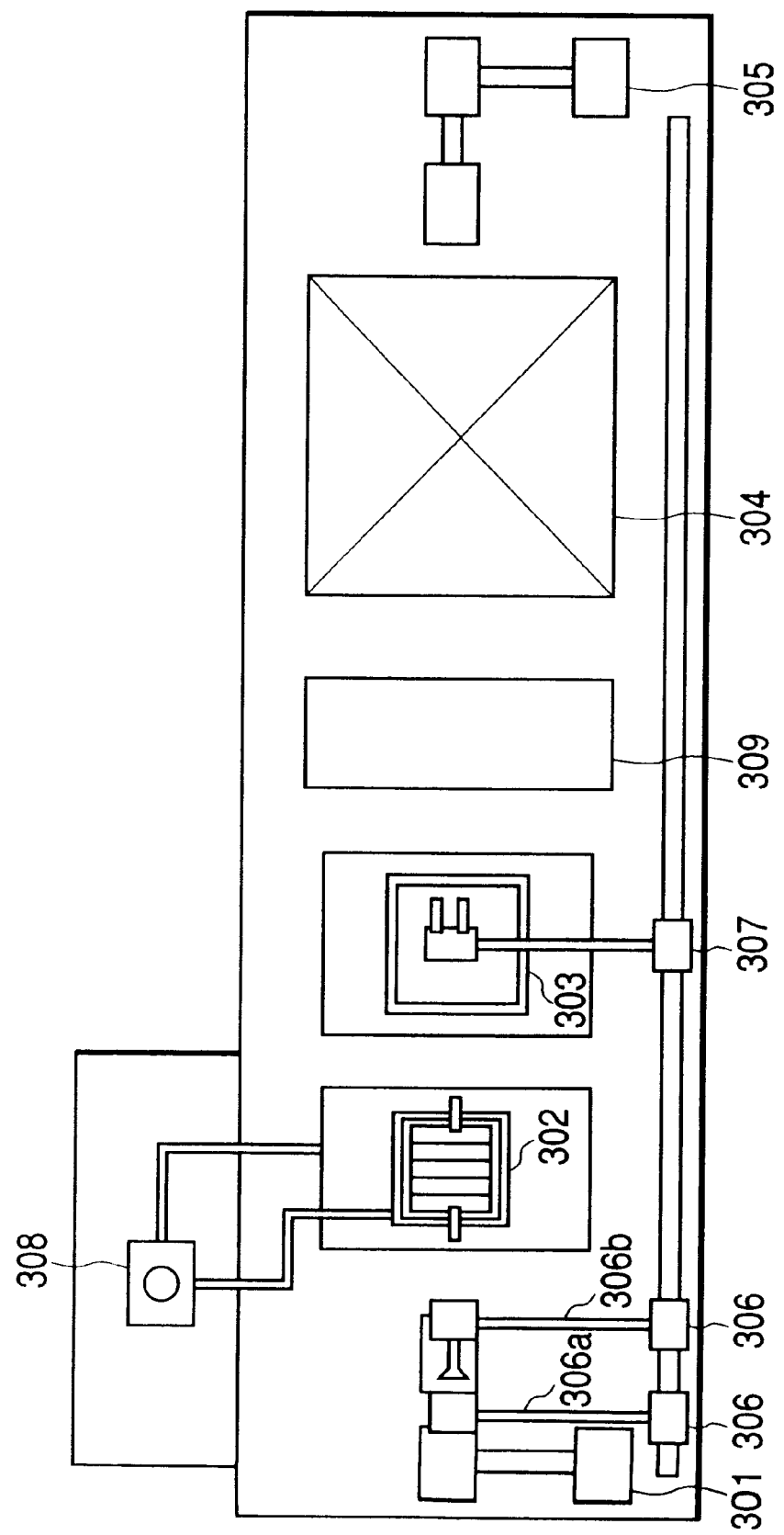
FIG. 13 is a diagrammatic view showing a system having an anodization unit and a cleaning unit separately, used in the present invention.
Figure 14:
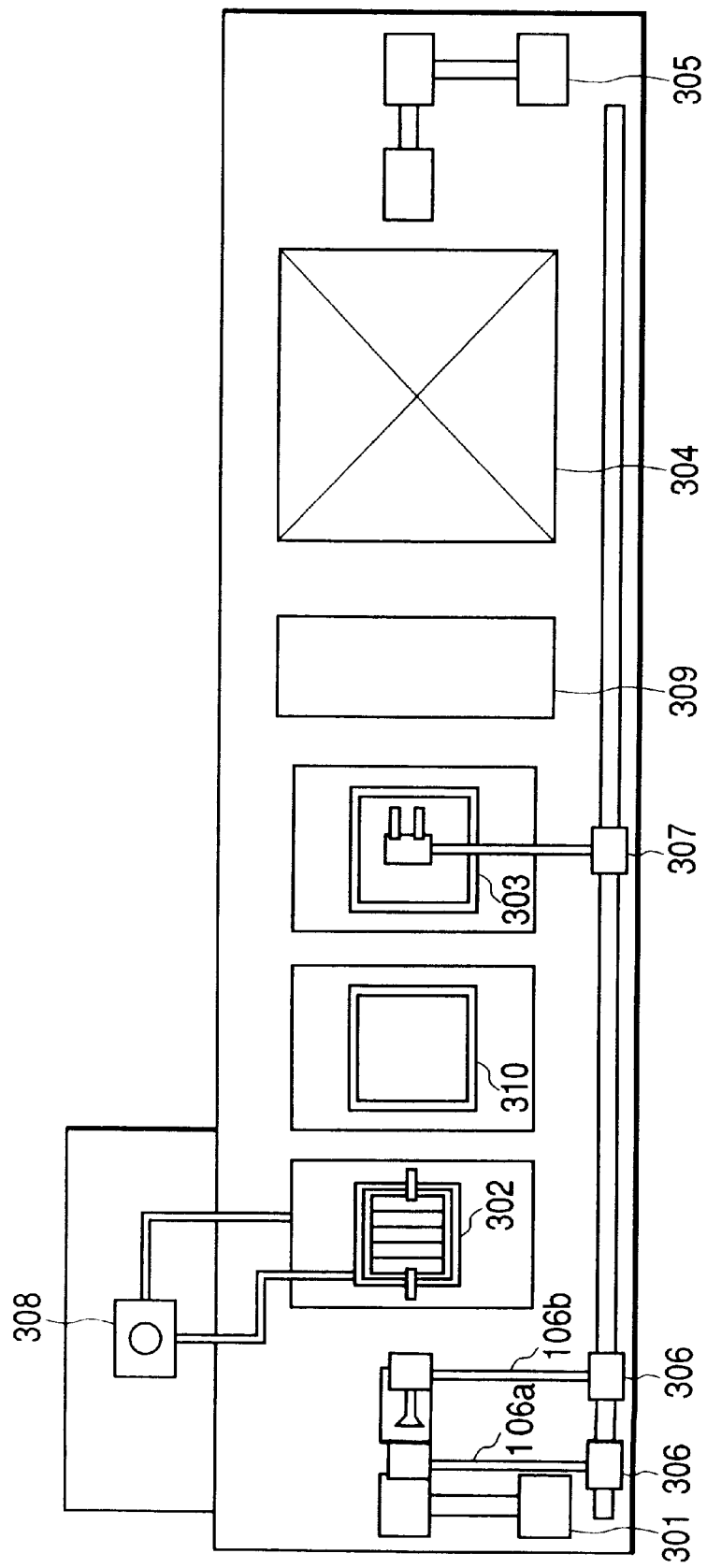
FIG. 14 is a diagrammatic view showing a system having an anodization unit and a cleaning unit separately, used in the present invention as another type.

FIG. 11 shows a holder and a substrate transport robot, which are used in an anodization unit in the present invention. FIG. 12 shows the anodization unit. FIGS. 13 and 14 show anodization and cleaning systems used in the present invention.

The unit shown in FIG. 12 is a unit by which three substrates as treatment targets can be anodized at one time. As shown in FIG. 11, a substrate-holding member (hereinafter "holder") 102 in the anodization unit is a square plate provide with a circular opening 103 substantially at the center thereof. Along the opening 103, a ring-type substrate attraction (suction) pad (hereinafter "pad") 104 is embedded. A groove is made in the pad on its surface, and the interior of the groove can be brought into a vacuum through an evacuation line 105 from the back of the pad. Reference numerals 106a and 106b each denote a substrate transport robot, which operates as a pair. First, the robot 106a holds a treatment target W on its back by a vacuum attraction and brings it to the holder 102 so as to be parallel to its face. Next, the robot 106b is passed from the opening 103 of the holder 102 through the part turning in an L-shape, and it waits for the treatment target W to approach. The robot 106b uses vacuum attraction, like the robot 106a. At the time the back of the treatment target W has come into contact with the leading end of the robot 106b, the robot 106b holds the treatment target W by attraction (suction), and the robot 106a release its attraction to move away in the upward direction. Subsequently, the robot 106b moves to the right as shown in the drawing, so that the back of the treatment target W comes into contact with the pad 104. Here, the interior of the groove in the pad 104 is kept at vacuum by the evacuation line 105, and the pad 104 holds the treatment target W by attraction. The robot 106b passes through the opening 103 and moves away in the upward direction. Thus, the treatment target W is held by holder 102. Also, when the treatment target W is detached therefrom, the above procedure is followed in reverse.

As shown in FIG. 12, an anodizing bath 210 of the anodization unit is fitted with a negative electrode 206a and a positive electrode 206b at both ends. Three holders 102 are arranged in series in such a way that they are held between these electrodes fitted in pair. FIG. 12 shows a state where the treatment target W has already been held by each holder 102. The spaces between the electrodes 206a and 206b and the holders 102 and between the holders 102 are each filled with an electrolytic solution 209, and are respectively separated with the treatment targets. Anodization is carried out in this state by applying a direct-current voltage across the electrodes 206a and 206b. After the anodization is completed, waste-liquid outlets 208 are opened, and the electrolytic solution 209 is discharged therethrough. These holders 102 function like the bottom of the bath 61 of the unit shown in FIG. 6.

As shown in FIG. 13, an anodization system installed with the above anodization unit has a loader 301, an anodizing bath 302, a cleaning bath 303, a spin dryer 304 and an unloader 305 in this order from the left as viewed in the drawing. In the direction of this arrangement, a substrate (wafer) sheet-by-sheet transport robot 306 and a carrier transport robot 307 are provided. The substrate sheet-by-sheet transport robot 306 further comprises two portions 306a and 306b as shown in FIG. 13. The cleaning bath 303 is provided so that it can circulate an aqueous solution containing at least one selected from an alcohol and acetic acid and so that it can feed pure water. This system also has a system 308 in which the electrolytic solution in the anodizing bath is filtered in a circulating manner.

Substrates as treatment targets W placed in the loader 301 are set in the holders 102 by the wafer transport robot 306, and are disposed in the anodizing bath 302.

Substrates having been subjected to anodization in the anodizing bath 302 are taken out of the holders 102 by the robot 306, and are transported to the cleaning bath 303. In the cleaning bath 303, the substrates are cleaned with an aqueous solution containing at least one selected from an alcohol and acetic acid. Subsequently, they are cleaned with pure water in the same bath.

The substrates thus cleaned by the aid of the robot 307 are transported to a robot dryer 309 together with the carrier, and are dried there once.

Subsequently, the substrates are taken out from the carrier sheet by sheet, and then spin-dried in the spin dryer 304.

The substrates having been dried are sent out to the unloader 305.

Thus, the treatment of step S11 through step S13 is carried out in one lot.

FIG. 14 shows a modification of the system shown in FIG. 13, in which another cleaning bath is added to the cleaning bath provided solely in the system shown in FIG. 13. A first cleaning bath 310 circulates the aqueous solution containing an alcohol and/or acetic acid, and has a filtration system. In a second cleaning bath 303, only pure water is supplied and the final cleaning is carried out with water.

In the systems of the present invention as shown in FIGS. 13 and 14, the units constructed like those shown in FIGS. 6 to 9, 11 and 12 may be used as the anodizing bath or the cleaning bath. In FIG. 14, other reference numerals denotes the same as those shown in FIG. 13.

Embodiment 1

Again with reference to FIG. 1 and others, the process for producing the non-porous film and bonded substrate according to a preferred embodiment of the present invention will be described in greater detail by taking the case of silicon as an example.

Single-crystal silicon wafers are prepared as the non-porous body 1 (FIG. 10), the surface of each wafer is made porous in a depth of from about 1 $\mu$m to about 30 $\mu$m by means of the anodizing unit as shown in FIG. 6 or 12, thus a porous single-crystal silicon layer is formed as the porous layer 2. The porous layer formed here may preferably be made to have a porosity of from about 5% to 70%, and more preferably from 10% to 50%, in approximation. Also, it is preferable to change anodizing current density, HF concentration and so forth in the course of the anodization so that the porous layer can be made to have at least a two-layer multi-layer structure having porosities different from one another.

Subsequently, using the system shown in FIGS. 7 to 9 and 13 or 14, the silicon wafers whose surfaces have been made porous are cleaned with a cleaning solution comprised of an aqueous solution containing an alcohol and/or acetic acid at a concentration of at least 4% by weight. Thereafter, the cleaning solution is replaced with pure water to clean the silicon wafers, followed by drying.

The silicon wafers thus cleaned are each optionally subjected to heat treatment at about 200° C. to about 600° C. to oxidize the inner walls of the pores in the porous layer to form oxide films on the inner-wall surfaces. The pore walls remain consisting chiefly of silicon.

On the porous layer 2, the non-porous layer 3 comprised of single-crystal silicon is formed by CVD, sputtering, molecular-beam epitaxy or liquid-phase epitaxy.

On the surface of the non-porous layer 3, a silicon oxide film is optionally formed as the insulating film 4.

The surface of the insulating film 4 and the surface of a single-crystal silicon wafer or supporting base 5 comprised of quartz glass are brought into contact to be bonded. In the case where the insulating film 4 is not formed, the non-porous layer 3 is bonded to the supporting base 5. In order to enhance the bond strength, the multi-layer structure thus formed by bonding may be subjected to a heat treatment in an atmosphere of an inert gas or in an atmosphere of an oxidative gas, or be subjected to anodic bonding.

From the multi-layer structure, the non-porous silicon wafer 1 is removed by grinding, lapping or RIE (reactive ion etching) on the back side, which is opposite to the bonded-face side.

The uncovered porous layer 2 is further selectively etched with the etchant as previously described. Thus, a bonded substrate having a non-porous film on the supporting base 5 is obtained.

The treatment to make the silicon substrate porous by anodization, i.e., to form pores therein, is carried out in, e.g., the aqueous HF solution. For this treatment, the presence of holes in the silicon crystal is known to be indispensable, and the mechanism of their reaction is presumed as follows.

First, holes in the silicon substrate having undergone electrolysis in the aqueous HF solution are induced to the surface of the negative-electrode side. As a result, the density of Si—H bonds, which are present in such a form that they compensate unbonded arms at the surface increases. At this time, fluorine ions in the aqueous HF solution attack the Si—H bonds nucleophilically to form Si—F bonds. As a result of this reaction, one electron is released to the positive-electrode side simultaneously with the generation of $H_2$ molecules. Because of the polarization characteristics of the Si—F bonds, Si—Si bonds in the vicinity of the surface become weak. Such weak Si—Si bonds are attacked by HF or $H_2O$, and the Si atoms on the crystal surface turn into $SiF_4$ to become liberated from the crystal surface. As a result, hollow portions (concavities) are produced on the crystal surface, and distribution of electric fields that attracts holes preferentially occurs at this part, so that such surface heterogeneity expands and the etching of silicon atoms progresses continuously along the electric fields. Incidentally, the solution used in the anodization is not limited to the aqueous HF solution, and other electrolytic solutions may be used.

The etching of silicon in the step of anodization is explained by the following reaction scheme.

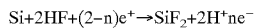

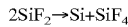

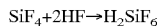

Namely, the reaction with hydrofluoric acid brings about the formation of a silicone compound $H_2SiF_6$, so that the silicon is etched. The above reaction scheme also shows that the $H_2SiF_6$ is formed in a larger quantity with an increase in the concentration of HF. This $H_2SiF_6$ is hardly reactive with, i.e., sparingly soluble in, acid (including hydrofluoric acid) or alkali solutions.

The progress of the anodization reaction also brings about the formation of the pores of tens to hundreds of angstroms at the substrate surface, and the pores extend ahead along the direction of electric fields. Namely, the electrolytic solution (aqueous hydrofluoric acid solution) enters the pores and causes the reaction at the tip of the pores. Then, even when the electric fields disappear, the pores in which the hydrofluoric acid solution is confined generate at random. What comes into question at this stage is that the hydrofluoric acid solution confined in the pores continues the reaction even after the electric fields have disappeared, to continue forming the $H_2SiF_6$. Where the $H_2SiF_6$ thus formed adheres to the inner walls of the pores, the selective etching of the porous silicon layer, finally carried out in the process, becomes uneven.

In the selective etching of the porous layers, the non-porous layer that is left without being etched and the porous layer that is removed are both the like single-crystal silicon in many cases. Hence, although, in principle, chemical etching rates should be equal, the etchant in the pores of the porous layers etches the pore wall surfaces so that the porous layer is etched not only from the layer surface but also from the ineterior of the pores. Thus, the etching of the porous body results in a physical breakdown of the whole layer.

Accordingly, in order to etch the porous layer uniformly, the $H_2SiF_6$ must be kept from being randomly generated in the pores. To this end, it is important to replace as much of the HF that remains in the pores as possible, with a liquid that cannot etch the pores. Also, in order to remove the porous layer uniformly, it is preferable to form oxide films on the pore inner walls of the porous layer, where it is also desirable to keep the $H_2SiF_6$ from being formed.

FIGS. 15A to 15D diagrammatically show the interior of the pores in the porous layer when cleaned with pure water and dried after the anodization is completed.

Figure 15A:
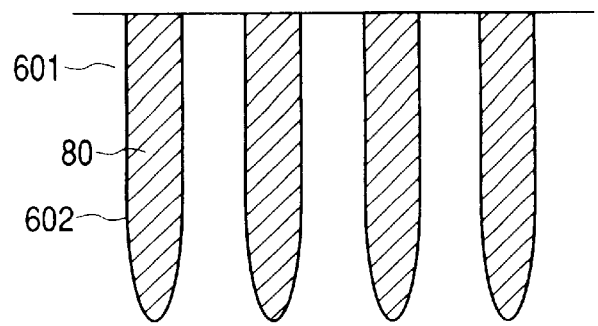
FIG. 15A, FIG. 15B, FIG. 15C and FIG. 15D are diagrammatic views to illustrate the action of cleaning by a conventional method.

FIG. 15A shows a cross section of the porous layer immediately after it has been taken out to the atmosphere after the anodization is completed. Pores 602 are formed as a result of the anodization of a substrate 601, and an electrolytic solution 80 remains in the pores. The electrolytic solution is in many cases, as stated previously, a mixture solution of HF and an alcohol.

Figure 15B:
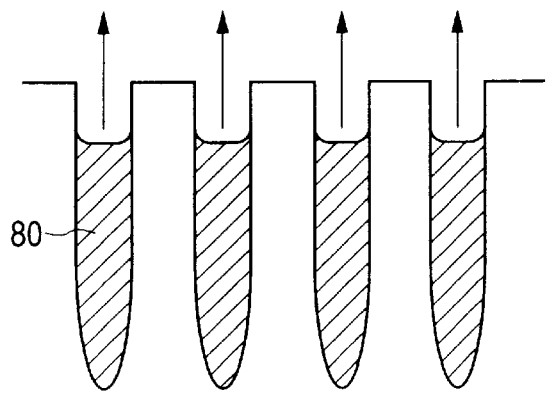

FIG. 15B shows the interior of pores after the porous layer has been left in the atmosphere for a few minutes. The water content or alcohol content in the electrolytic solution 80 has evaporated in part and the aqueous HF solution remaining in the depths of the pores in the state it has been concentrated.

Figure 15C:
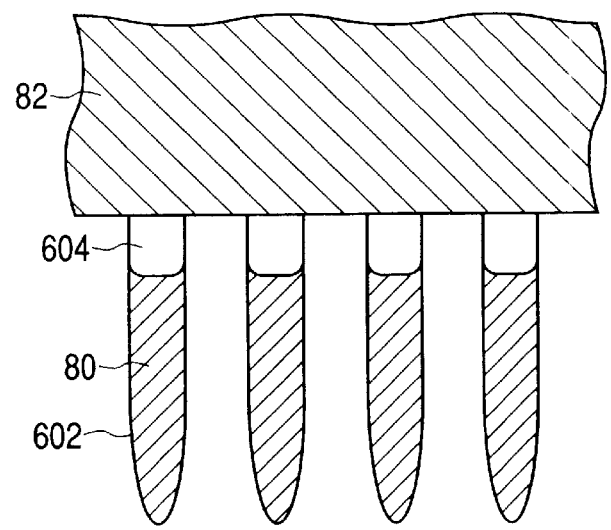

FIG. 15C shows how the porous layer is cleaned with pure water 82.

In general, liquid enters the pores by capillarity, and is mixed with a thick, aqueous HF solution. Subsequently, the hydrofluoric acid diffuses out of the pores and is gradually replaced with pure water. Thus, the cleaning is effected.

Figure 15D:
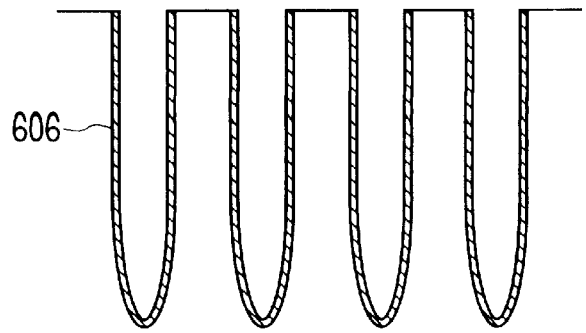

At this stage, the entering depth H in the case where the liquid enters the pores by capillarity is expressed by the following equation.

$$H = 2\gamma \cdot \cos\theta / a\rho g$$

where $\gamma$ is surface tension; $\theta$, contact angle of the liquid with respect to the substrate; a, pore size of the porous body; $\rho$, density of the liquid; and g, acceleration of gravity. At this stage, the surface of the porous layer is hydrophobic because of the hydrofluoric acid, and hence has a very large contact angle $\theta$. Hence, the entering depth H of the water is nearly zero. Namely, the pure water 82 for cleaning can hardly enter the pores 602. For this reason, a layer 604 of air is necessarily formed in the vicinity of the surfaces of the pores 602. Once this has occurred, even if there is an attempt to remove the water by drying with a spin dryer or the like after cleaning with pure water, the hydrofluoric acid in the pores 602 is not replaced with water, with its concentration continuing to increase. Finally, the solution remaining in the pores 602 dries up completely, so that, as shown in FIG. 15D, a secondary-product dry matter 606 adheres to the pore wall surfaces. This dry matter 606 is the $H_2SiF_6$ stated above. In FIG. 15D, a state is illustrated where the dry matter 606 is adhered to all the pores. Actually, it adheres only to a part of the massive pores, or dry matter 606 having a different thickness for each pore, resulting in unevenness.

Figure 16A:
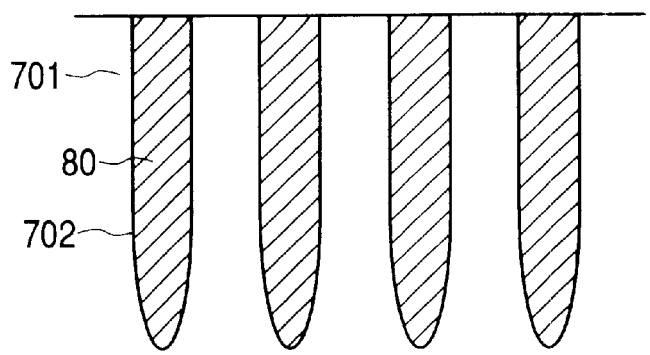
FIG. 16A, FIG. 16B and FIG. 16C are diagrammatic views to illustrate the action of cleaning according to the present invention.
Figure 16B:
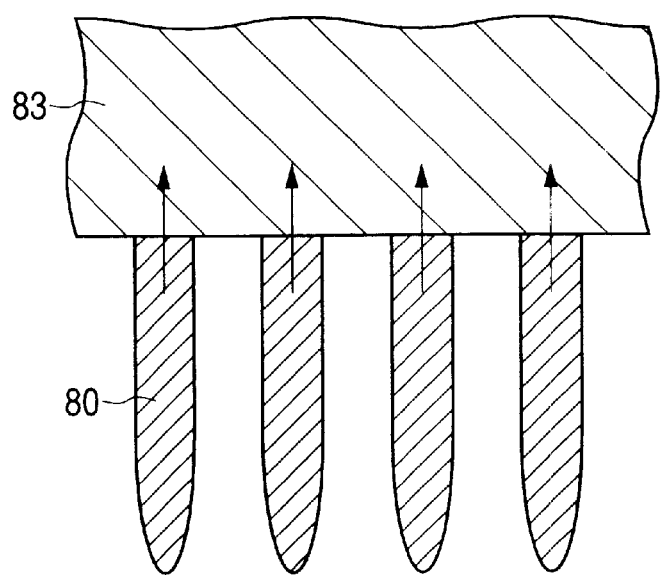
Figure 16C:
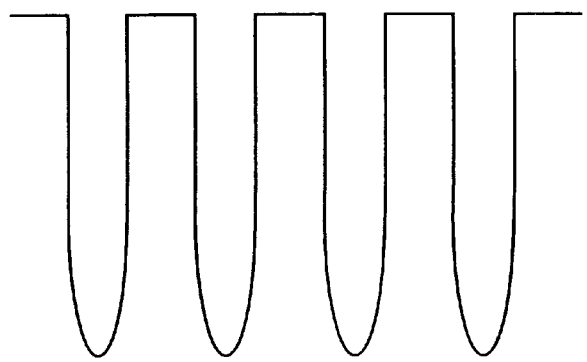

On the other hand, FIGS. 16A to 16C diagrammatically show the interior of pores in the porous layer when cleaned with the aqueous solution containing an alcohol and/or acetic acid after the anodization is completed.

FIG. 16A shows a cross section of the porous layer immediately after it has been taken out to the atmosphere after the anodization is completed. Reference numeral 701 denotes a substrate; 702, pores; and 80, an electrolytic solution.

FIG. 16B shows how the porous layer is cleaned with the aqueous solution containing an alcohol and/or acetic acid. Because the alcohol and/or acetic acid act like a surface-active agent, the above contact angle θ is so small that the solution can enter the pores with ease. Hence, the aqueous solution containing an alcohol and/or acetic acid, 83, and the electrolytic solution 80 can quickly interchange. Then, sufficient cleaning with water may be carried out, so that the concentration of the electrolytic solution 80 is dramatically lowered and almost all the electrolytic solution in the pores is replaced with water. After drying with a spin dryer or the like, as shown in FIG. 16C, a porous silicon layer without any secondary products ascribable to HF in the pores can be obtained.

Embodiment 2

The process for producing the non-porous film and bonded substrate according to another preferred embodiment of the present invention will be described in greater detail by taking the case of silicon as an example.

Single-crystal silicon wafers are prepared as the non-porous body 1, the surface of each wafer is made porous in a depth from about 1 μm to about 30 μm by the anodizing unit as shown in FIG. 6 or 12, thus, a porous single-crystal silicon layer is formed as the porous layer 2. The porous layer formed here may preferably have porosity approximately from about 5% to 70%, and more preferably from 10% to 50%. Also, anodizing current density, HF concentration or the like is changed in the course of the anodization so that the porous layer can have at least a two-layer multi-layer structure having porosity that is higher inside the substrate than at the surface.

Subsequently, using the system shown in FIGS. 7 to 9 and 13 or 14, the silicon wafers whose surfaces have been made porous are cleaned with a cleaning solution comprised of an aqueous solution containing an alcohol and/or acetic acid in a concentration of at least 4% by weight. Thereafter, the cleaning solution is replaced with pure water to clean the silicon wafers, followed by drying.

The silicon wafers thus cleaned are each optionally subjected to heat treatment at about 200° C. to about 600° C. to oxidize the inner walls of the pores in the porous layer to form oxide films on the inner-wall surfaces.

On the porous layer 2, the non-porous layer 3 comprised of single-crystal silicon is formed by CVD, sputtering, molecular-beam epitaxy or liquid-phase epitaxy.

On the surface of the non-porous layer 3, a silicon oxide film is optionally formed as the insulating film 4. The surface of the insulating film 4 and the surface of a single-crystal silicon wafer or supporting base 5 comprised of quartz glass are brought into contact to be bonded. In order to enhance their bond strength, the resultant multi-layer structure may be subjected to a heat treatment in an atmosphere of an inert gas or in an atmosphere of an oxidative gas, or to anodic bonding.

Then, a dividing member such as a wedge or a blade is inserted to the side face of the multi-layer structure to divide the multi-layer structure into two parts. Thus, the porous layer, having a low mechanical strength, is cracked at its interior or interface and the multi-layer structure is divided into two parts. A fluid such as a liquid or gas may be jetted onto the side face of the multi-layer structure to divide the multi-layer structure mechanically. Alternatively, the multi-layer structure may be irradiated by light to generate heat therein or may be heated from the outside so that an internal stress can be produced in the multi-layer structure, and the force thereby produced may be utilized to divide the multi-layer structure.

As a result of dividing, the non-porous layer is transferred onto the supporting base. Since a residual layer of the porous layer 2 is present on this non-porous layer, this layer is selectively etched with the etchant described previously. According to the present embodiment, no unwanted secondary product remains in the pores of the porous layer, and hence the non-porous layer after etching can be free from any uneven film thickness.

Then, the non-porous layer on the supporting base may optionally be subjected to a heat treatment in a reducing atmosphere containing hydrogen, to make the surface smooth and also to diffuse out and remove boron and so forth contained in the non-porous layer.

Thus, a bonded substrate having the non-porous layer can be obtained which is preferable as an SOI substrate.

Embodiment 3

The process for producing the non-porous film and bonded substrate according to still another preferred embodiment of the present invention will be described in detail by taking the case of silicon as an example.

Single-crystal silicon wafers are prepared as non-porous treatment targets. Each wafer is subjected to anodization using the anodizing unit shown in FIG. 6 or 12, to form a porous silicon layer 2 as shown in step S11 in FIG. 10.

As conditions for the anodization, first, using a mixture solution of hydrofluoric acid and ethanol, a low-porosity, first porous layer having a porosity from 5% to 30% and a thickness from 1 μm to 29 μm may be formed under a low density current. Then, after the changing to a high density current, a high-porosity, second porous layer having a porosity from 30% to 70% and a thickness from 1 nm to 3 μm may be formed beneath the first porous layer.

Next, as shown in step S12 in FIG. 10, cleaning is carried out using the system shown in FIGS. 7 to 9 and 13 or 14. Thus, the interior of the pores of the porous silicon layer 2 having the double-layer structure with porosities different from each other is cleaned with the cleaning solution containing an alcohol and/or acetic acid. In the case where the low-porosity layer is formed on the surface side, cleaning according to the present invention is particularly effective.

Thereafter, as shown in step S13 in FIG. 10, the porous silicon layer 2 is cleaned with pure water, followed by drying.

The porous silicon layer 2 is subjected to a heat treatment at 200° C. to 600° C. in an oxidizing atmosphere to form oxide films on the pores' inner walls.

Oxide film formed on the layer surface of the porous silicon layer 2, whose pores' inner walls have been oxidized, is removed with diluted hydrofluoric acid. At this stage, the greater part of the oxide films on the pore inner walls remains.

The wafers on each surface of which the porous silicon layer 2 has been formed are set in an epitaxial growth apparatus, and the porous silicon layer 2 is pre-baked in an atmosphere of hydrogen at a temperature raised to 900° C. to 1,000° C.

A silicon gas such as $SiH_4$ is introduced to stop up the surface pores of the porous silicon layer 2. Once the introduction of silicon gas is stopped, the heat treatment is carried out in an atmosphere of hydrogen at a temperature raised to 1,000° C. to 1,200° C. Then, a silicon gas such as $SiH_2Cl_2$ is introduced to carry out an epitaxial growth at a temperature dropped to 900° C. to 1,000° C., to form a non-porous layer 3 on the porous silicon layer 2 whose pores' inner walls have been oxidized.

An insulating layer is formed on the non-porous layer 3. The insulating layer is then bonded to the supporting base 5 to form a multi-layer structure, followed by a heat treatment at 1,000° C. to 1,200° C.

A wedge made of resin or metal is inserted to the side face of the multi-layer structure to cause the porous layer of the multi-layer structure to crack at its side face.

A fluid comprised of a liquid or gas is jetted onto the side face of the multi-layer structure to cause the porous layer to crack even further inward.

Thus, the multi-layer structure is divided at the interface between the high-porosity second porous layer and the low-porosity first porous layer.

The low-porosity first porous layer having oxide films in its pores inner walls and remaining on the non-porous layer 3 transferred to the supporting base 5 side is removed by etching or the like. Since HF in the pores has been removed by cleaning after the anodization, the remaining porous layer can be uniformly removed.

The surface of the non-porous layer 3 is smoothed by hydrogen annealing or the like.

The non-porous layer 3 thus obtained can have a smooth surface free of any uneven film thickness.

EXAMPLES

Example 1

A silicon wafer as a treatment target was set in the unit shown in FIG. 6, and as an electrolytic solution, an anodizing electrolytic solution prepared by mixing hydrofluoric acid of 49% by weight in HF concentration, water and ethanol in a volume ratio of 1:1:1 was fed into the bath. A direct-current voltage providing a constant electric current of 7 mA/cm$^2$ was applied to the wafer for 10 minutes. As a result, a porous silicon layer having a porosity of about 20% was uniformly formed on one surface of the wafer in a thickness of 12 µm.

Subsequently, the electrolytic solution was discharged through the drain, and a cleaning solution prepared by mixing isopropanol and water in a volume ratio of 1:1 was poured into the bath from the upper part. This cleaning solution was retained for 1 minute in the state the bath is filled with it, to carry out the cleaning, and thereafter the cleaning solution was discharged from the bath.

Next, pure water was poured from the upper part. The pure water was allowed to overflow to clean (rinse) the wafer for about 20 minutes. Then the wafer was taken out, and dried by a spin dryer. Thereafter, this wafer was left in the atmosphere for a week, but no change was seen at all in the porous silicon of the wafer.

Comparative Example 1

In Example 1, the cleaning step making use of the cleaning solution containing an alcohol as described above was omitted, and the wafer cleaned with pure water was spin-dried immediately after the anodization. The obtained wafer was left in the atmosphere for 10 hours. As a result, the porous silicon surface of the wafer changed in structure to become cloudy.

Example 2

Using the unit 40 shown in FIG. 7, anodization was carried out under the same conditions as in Example 1. Next, after the anodizing electrolytic solution was completely discharged, the wafer thus anodized was moved to the cleaning unit 41 by the horizontal transfer robot. The wafer was rotated at 500 r.p.m. while feeding ethanol (100%) from the nozzle to the wafer to clean the wafer surface for 20 seconds.

Subsequently, the wafer was moved to the pure-water cleaning unit 42 by the horizontal transfer robot, where the wafer was rotated at 400 r.p.m. while being jetted with jetting out pure water from the upper nozzle and lower nozzle to clean the wafer for 15 minutes. After the cleaning, the jetting of pure water was stopped, and the wafer was rotated at 800 r.p.m. in the same unit to be dried.

The porous silicon surface of the wafer cleaned in this manner did not change even after it was left for a week as in Example 1, and maintained a very stable state.

Example 3

In this example, using the unit shown in FIG. 7, the anodization, the cleaning with alcohol, the cleaning with pure water and the drying were carried out in the same manner as in Example 2, except that for the cleaning with pure water, an ultrasonic vibrator was installed at the tip of the upper nozzle, so that the pure water provided with ultrasonic vibration was fed to the wafer to further improve the cleaning.

While in Example 2 the cleaning with pure water had to be carried out for 15 minutes, in Example 3 the same cleaning effect was achieved by cleaning only for 10 minutes because of the addition of the ultrasonic vibrations.

Example 4

In Example 4, the cleaning with pure water and the drying were carried out using the unit shown in FIG. 8.

The anodization and the cleaning with alcohol were carried out under the same conditions as in Example 2. Thereafter, the substrate was cleaned with pure water using the unit shown in FIG. 8. Subsequently, while the substrate was hermetically sealed in the same bath, it was spin-dried and simultaneously dried by vacuum deaeration. As a result, little water remained in the pores, and a more stable porous silicon was obtained.

Example 5

Using as an electrolytic solution an aqueous solution of 10% by volume of hydrofluoric acid, voltage was applied for 7 minutes so as to provide a constant electric current of 10 mA/cm² in current density at the time of anodization, to make porous an n-type silicon wafer having a resistivity of 0.007 Ω·cm. As a result, a porous silicon layer having a porosity of about 70% was uniformly formed on the surface of the wafer in a thickness of 12 μm. This wafer was immediately placed put in the cleaning unit shown in FIG. 9, to carry out alcohol cleaning using propanol vapor, and the wafer thus cleaned was dried while being raised.

Because of this cleaning and drying method, even high-porosity porous silicon was cleanable without causing any change in its structure.

As described above, in the cleaning of porous bodies, after the anodization the porous body is exposed to the atmosphere of the cleaning solution or cleaning vapor containing an alcohol. This makes it possible to prevent the deterioration of the porous bodies themselves that can occur because of insufficient removal of the anodizing solution remaining in pores, to prevent the corrosion of the surrounding devices due to components of evaporated anodizing solutions, and also to prevent the contamination caused by these components.

Example 6

As a treatment target, a 6-inch p-type (0.01–0.02 Ω·cm) silicon wafer (thickness: 625 μm) was prepared. Using the unit shown in FIG. 6, as an electrolytic solution, an aqueous HF solution prepared by mixing hydrofluoric acid of 49% by weight in HF concentration and ethanol in a volume ratio of 2:1 which were fed into the anodizing bath. The anodizing electric current was set at 1 mA/cm² and the anodization was continued for 11 minutes to form a porous silicon layer on the surface of the silicon wafer. The anodized silicon wafer was immersed in an aqueous solution containing 10% by weight of isopropanol and was left there for 3 minutes. Thereafter, the silicon wafer was immersed in pure water for 10 minutes to be cleaned, followed by drying.

This silicon wafer was subjected to a heat treatment at 400° C. for 1 hour in an atmosphere of oxygen in an oxidizing furnace to oxidize pore wall surfaces of the porous layer. Next, the oxide film formed on the porous layer surface was removed with an aqueous HF solution. Then, the wafer was put in a CVD system to be baked in an atmosphere of hydrogen, followed by epitaxial growth to form, on the porous layer whose pores wall surfaces have been oxidized, a 0.3 μm thick epitaxial layer formed of non-porous single-crystal silicon. The surface of this epitaxial layer was oxidized at 1,100° C. by hydrogen combustion to form a 0.2 μm thick silicon oxide film. Subsequently, this structure was bonded to a 6-inch silicon wafer prepared separately, followed by a heat treatment at 1,100° C. for 2 hours in an atmosphere of nitrogen and oxygen to obtain a multi-layer structure. The back of the silicon wafer whose surface was made porous was grounded in a depth of about 615 μm by a grinder called a back grinder, to uncover the porous silicon layer. The multi-layer structure with the uncovered porous silicon layer was immersed in a solution prepared by mixing hydrofluoric acid and hydrogen peroxide water in a volume ratio of 1:100, to remove the porous silicon layer by selective etching.

Figure 17:
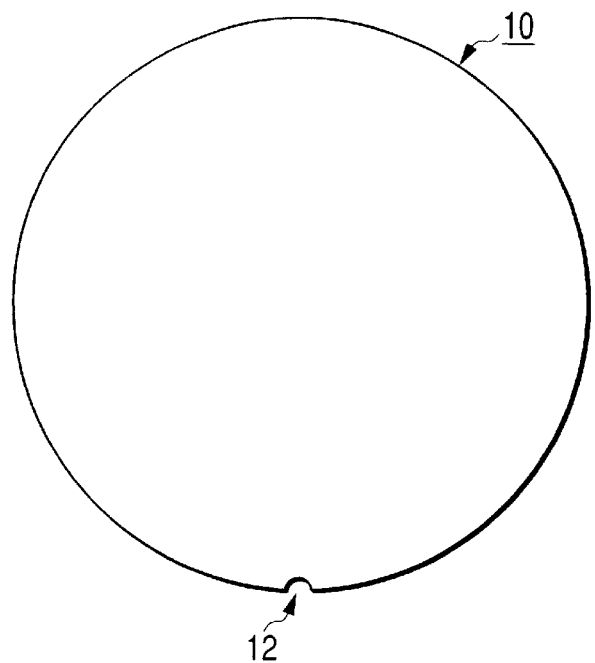
FIG. 17 is a top plan view showing an appearance of a bonded substrate obtained by the process of the present invention.
Figure 18:
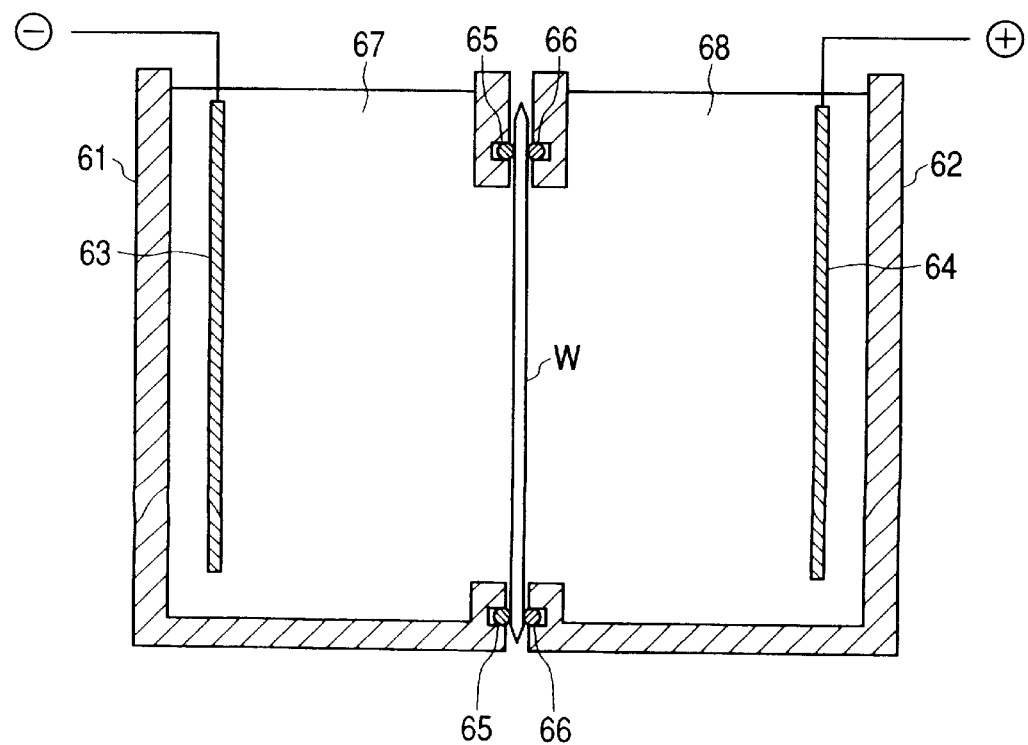
FIG. 18 is a diagrammatic view showing a conventional anodization unit.
Figure 19:
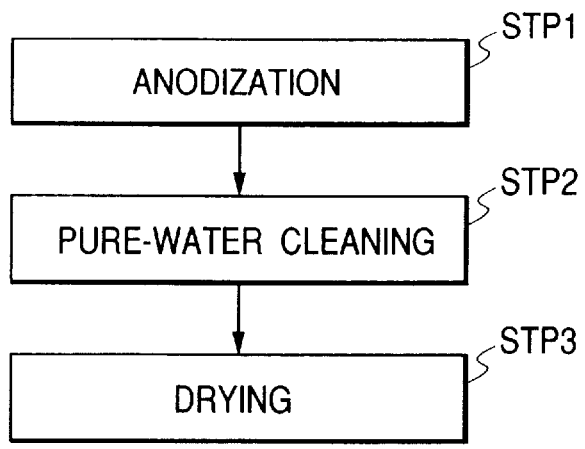
FIG. 19 is a flow chart of the steps of cleaning a porous body in a conventional method.

No spotlike uneven film thickness was observed on the resulting bonded substrate as shown in FIG. 17. Thereafter, the bonded substrate was subjected to hydrogen annealing to obtain an SOI substrate having an active layer in a thickness of 0.2 μm and a buried oxide film in a thickness of 0.2 μm, which was formed of non-porous single-crystal silicon and had a smooth surface.

Example 7

The same silicon wafer as that in Example 6 was prepared, and was subjected to anodization under the same conditions as in Example 6.

After the anodization, the wafer was immersed for 3 minutes in a bath filled with a cleaning solution comprised of pure water to which 15% by weight of isopropanol was added. Thereafter, the cleaning solution was discharged out of the bath, and then the same bath was filled with pure water to clean the wafer with the pure water for 10 minutes.

Thereafter, the same treatment as that in Example 6 was carried out to etch the porous silicon layer selectively.

The above process yielded an SOI substrate having an active layer in a thickness of 0.2 μm and a buried oxide film in a thickness of 0.2 μm.

Comparative Example 2

The same silicon wafer as that in Example 6 was prepared, and was subjected to anodization under the same conditions as in Example 6. The wafer having been thus anodized was immersed in pure water, and was left for 10 minutes to effect cleaning, followed by drying.

Next, the same treatment as that in Example 6 was carried out to etch the porous silicon layer selectively.

Figure 21:
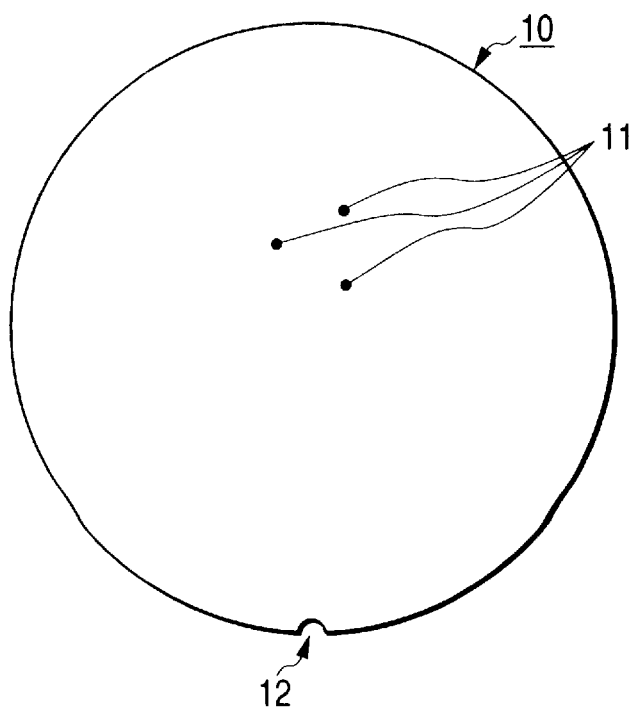
FIG. 21 is a top plan view showing an appearance of a bonded substrate obtained by a conventional process.
Figure 20:
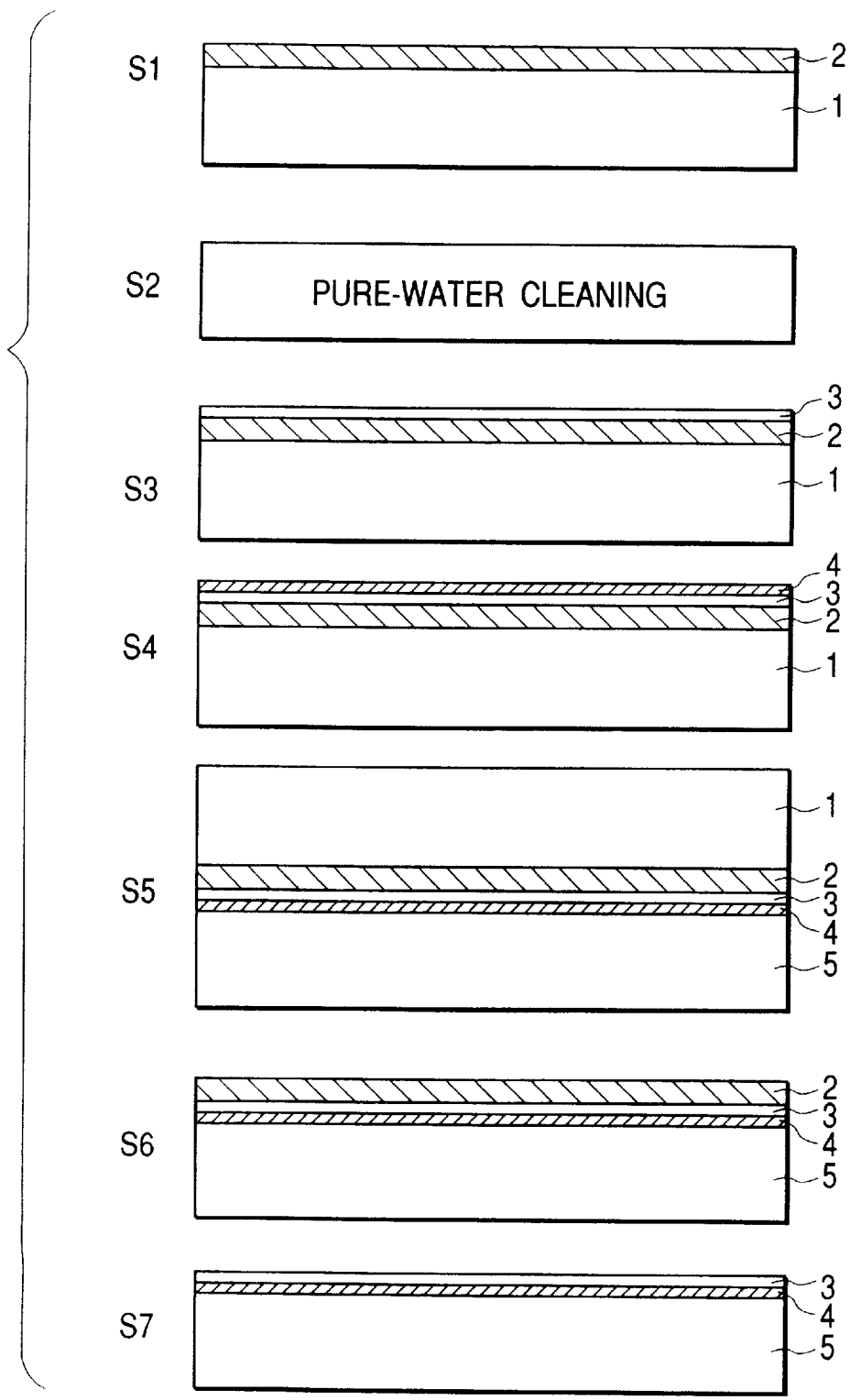
FIG. 20 is a flow chart of a conventional process for producing a bonded substrate.

The resulting bonded substrate was observed to have, spotlike uneven film thickness 11 like the one shown in FIG. 21, which was 2 mm to 7 mm in diameter and was a film thickness smaller by about 2 nm to about 7 nm than that of the surrounding area. This uneven film thickness did not easily disappear even when the wafer was thereafter subjected to hydrogen annealing.

As described above, in the cleaning of porous bodies, after the anodization the porous body is exposed to the atmosphere of the cleaning solution or cleaning vapor containing an alcohol. This makes it possible to prevent the uneven film thickness from occurring, which can occur because of the insufficient removal of the anodizing solution remaining in the pores.

What is claimed is:

1. A method of cleaning a porous body formed by anodization, comprising the step of cleaning the porous body after the anodization is completed, with a cleaning solution containing at least one of an alcohol and acetic acid.

2. The method of cleaning a porous body according to claim 1, wherein after the cleaning step the porous body is further cleaned with pure water.

3. The method of cleaning a porous body according to claim 1, wherein the cleaning solution is an aqueous solution containing an alcohol.

4. The method of cleaning a porous body according to claim 1, wherein the cleaning solution comprises an alcohol.

5. The method of cleaning a porous body according to claim 1, wherein the cleaning step comprises the step of cleaning with a cleaning solution comprising an alcohol and the step of cleaning with a cleaning solution comprising an aqueous solution of an alcohol.

6. The method of cleaning a porous body according to claim 1, wherein the cleaning step comprises the step of exposing the porous body to a vapor of the cleaning solution.

7. The method of cleaning a porous body according to claim 1, wherein the cleaning step comprises the step of immersing the porous body in the cleaning solution.

8. The method of cleaning a porous body according to claim 1, wherein after the cleaning step the porous body is cleaned with pure water provided with an ultrasonic energy.

9. The method of cleaning a porous body according to claim 8, wherein the porous body has a region having a porosity lower than 70%.

10. The method of cleaning a porous body according to claim 1, wherein after the cleaning step the porous body is cleaned with pure water and thereafter the porous body thus cleaned is spin-dried and is further dried by deaeration.

11. The method of cleaning a porous body according to claim 1, wherein the cleaning step comprises exposing the porous body to a vapor of the cleaning solution, and moving the porous body thus cleaned, relatively from the inside of the vapor to the outside of the vapor to effect drying.

12. The method of cleaning a porous body according to claim 11, wherein the porous body has a region having a porosity of 70% or higher.

13. The method of cleaning a porous body according to claim 1, wherein the porous body is formed on the surface of a non-porous body base member.

14. The method of cleaning a porous body according to claim 1, wherein the porous body comprises a semiconductor.

15. A process for producing a non-porous film, comprising the step of forming a non-porous layer on the porous body having been cleaned by the method of cleaning a porous body according to claim 1.

16. The process for producing a non-porous film according to claim 15, which further comprises the step of removing the porous body.

17. A process for producing a non-porous film, comprising the steps of forming a porous layer by anodization, forming a non-porous layer on the porous layer, bonding the non-porous layer to a supporting base, and removing the porous layer, wherein;
the process further comprises the step of, after the anodization is completed, cleaning the porous layer with a cleaning solution containing at least one of an alcohol and acetic acid.

18. The process for producing a non-porous film according to claim 17, wherein after the cleaning step the porous layer is further cleaned with pure water.

19. The process for producing a non-porous film according to claim 17, wherein the cleaning solution is an aqueous solution containing an alcohol.

20. The process for producing a non-porous film according to claim 17, wherein the cleaning solution comprises an alcohol.

21. The process for producing a non-porous film according to claim 17, wherein the cleaning step comprises the step of cleaning with a cleaning solution comprising an alcohol and the step of cleaning with a cleaning solution comprising an aqueous solution of an alcohol.

22. The process for producing a non-porous film according to claim 17, wherein the cleaning step comprises the step of exposing the porous layer to a vapor of the cleaning solution.

23. The process for producing a non-porous film according to claim 17, wherein the cleaning step comprises the step of immersing the porous layer in the cleaning solution.

24. The process for producing a non-porous film according to claim 17, wherein after the cleaning step the porous layer is cleaned with pure water provided with an ultrasonic energy.

25. The process for producing a non-porous film according to claim 24, wherein the porous layer has a region having a porosity lower than 70%.

26. The process for producing a non-porous film according to claim 17, wherein after the cleaning step the porous layer is cleaned with pure water and thereafter the porous layer thus cleaned is spin-dried.

27. The process for producing a non-porous film according to claim 17, which further comprises the step of oxidizing the porous layer to form oxide films on the pore wall surfaces of the porous layer.

28. The process for producing a non-porous film according to claim 17, wherein the porous layer comprises a semiconductor.

29. A process for producing a porous body, comprising the steps of:
subjecting a non-porous body to anodization to form a porous body; and
cleaning the porous body after the anodization is completed, with a cleaning solution containing at least one of an alcohol and acetic acid.

30. The process for producing a porous body according to claim 29, wherein after the cleaning step the porous body is further cleaned with pure water.

31. The process for producing a porous body according to claim 29, wherein the cleaning solution is an aqueous solution containing an alcohol.

32. The process for producing a porous body according to claim 29, wherein the cleaning solution comprises an alcohol.

33. The process for producing a porous body according to claim 29, wherein the cleaning step comprises the step of cleaning with a cleaning solution comprising an alcohol and the step of cleaning with a cleaning solution comprising an aqueous solution of an alcohol.

34. The process for producing a porous body according to claim 29, wherein the cleaning step comprises the step of exposing the porous body to a vapor of the cleaning solution.

35. The process for producing a porous body according to claim 29, wherein the cleaning step comprises the step of immersing the porous body in the cleaning solution.

36. The process for producing a porous body according to claim 29, wherein after the cleaning step the porous body is cleaned with pure water provided with an ultrasonic energy.

37. The process for producing a porous body according to claim 36, wherein the porous body has a region having a porosity lower than 70%.

38. The process for producing a porous body according to claim 29, wherein after the cleaning step the porous body is cleaned with pure water and thereafter the porous body thus cleaned is spin-dried and is further dried by deaeration.

39. The process for producing a porous body according to claim 29, wherein the cleaning step comprises exposing the porous body to a vapor of the cleaning solution, and moving the porous body thus cleaned, relatively from the inside of the vapor to the outside of the vapor to effect drying.

40. The process for producing a porous body according to claim 39, wherein the porous body has a region having a porosity of 70% or higher.

41. The process for producing a porous body according to claim 29, wherein the porous body is formed on the surface of a non-porous body base member.

42. The process for producing a porous body according to claim 29, wherein the porous body comprises a semiconductor.

43. A process for producing a bonded substrate, comprising the steps of forming a porous layer by anodization, bonding to a supporting base a non-porous layer formed on the porous layer, and removing the porous layer, wherein;
the process further comprises the step of, after the anodization is completed, cleaning the porous layer with a cleaning solution containing at least one of an alcohol and acetic acid.

44. The process for producing a bonded substrate according to claim 43, wherein after the cleaning step the porous layer is further cleaned with pure water.

45. The process for producing a bonded substrate according to claim 43, wherein the cleaning solution is an aqueous solution containing an alcohol.

46. The process for producing a bonded substrate according to claim 43, wherein the cleaning solution comprises an alcohol.

47. The process for producing a bonded substrate according to claim 43, wherein the cleaning step comprises the step of cleaning with a cleaning solution comprising an alcohol and the step of cleaning with a cleaning solution comprising an aqueous solution of an alcohol.

48. The process for producing a bonded substrate according to claim 43, wherein the cleaning step comprises the step of exposing the porous layer to a vapor of the cleaning solution.

49. The process for producing a bonded substrate according to claim 43, wherein the cleaning step comprises the step of immersing the porous layer in the cleaning solution.

50. The process for producing a bonded substrate according to claim 43, wherein after the cleaning step the porous layer is cleaned with pure water provided with an ultrasonic energy.

51. The process for producing a bonded substrate according to claim 50, wherein the porous layer has a region having a porosity lower than 70%.

52. The process for producing a bonded substrate according to claim 50, wherein after the cleaning step the porous layer is cleaned with pure water and thereafter the porous layer thus cleaned is spin-dried.

53. The process for producing a bonded substrate according to claim 43, which further comprises the step of oxidizing the porous layer to form oxide films on the pore wall surfaces of the porous layer.

54. The process for producing a bonded substrate according to claim 43, wherein the porous layer comprises a semiconductor.

55. A process for producing a substrate provided with a porous layer comprising the steps of:
    anodizing a surface of a non-porous substrate with an anodizing solution to form a porous layer; and
    cleaning the porous layer, which has the anodizing solution remaining in its pores after the anodizing step, with a cleaning solution comprising at least one of an alcohol and acetic acid.

56. A process for producing a substrate with a non-porous layer on a porous layer comprising, in sequence, the steps of:
    anodizing a non-porous substrate to form the porous layer on a surface of the non-porous substrate;
    cleaning the porous layer with a cleaning solution containing at least one of an alcoholic and acetic acid; and
    forming the non-porous layer on the porous layer.

57. A process for producing a non-porous film comprising the steps of:
    preparing a first substrate with a non-porous layer on a porous layer;
    bonding the first substrate and a second substrate such that the non-porous layer is positioned inside to form a multi-layer structure; and
    separating the multi-layer structure at the porous layer,
    wherein preparing the first substrate comprises, in sequence, the steps of:
        i) forming the porous layer by anodization;
        ii) cleaning the porous layer with a cleaning solution containing at least one of an alcohol and acetic acid; and
        iii) forming the non-porous layer on the porous layer.

58. A process for producing a non-porous film comprising the steps of:
    preparing a substrate provided with a non-porous layer on a porous layer; and
    separating the non-porous layer at the porous layer,
    wherein preparing the substrate comprises, in sequence, the steps of:
        i) forming the porous layer by anodization;
        ii) cleaning the porous layer with a cleaning solution containing at least one of an alcohol and acetic acid; and
        iii) forming the non-porous layer on the porous layer.

59. The process for producing a non-porous film according to claim 58, wherein the porous layer comprises Si, Ge, GaAs, GaAlAs, SiGe or C.

60. The process for producing a non-porous film according to claim 58, wherein ultrasonic energy is applied during the cleaning step.

61. The process for producing a non-porous film according to claim 58, wherein the alcohol is methanol, ethanol or propanol.

62. The process for producing a non-porous film according to claim 58, wherein the cleaning step is carried out while rotating the porous layer.

63. The process for producing a non-porous film according to claim 58, wherein the non-porous layer comprises Si, Ge, GaAs, GaAlAs, Site or SiC.

* * * * *

UNITED STATES PATENT AND TRADEMARK OFFICE
CERTIFICATE OF CORRECTION

PATENT NO. : 6,410,436 B2
DATED : June 25, 2002
INVENTOR(S) : Kenji Yamagata et al.

It is certified that error appears in the above-identified patent and that said Letters Patent is hereby corrected as shown below:

<u>Title page,</u>
Item 30, Foreign Application Priority Data, insert
-- Mar. 26, 1999 (JP) ….…...11-083600 --.
Item [56], References Cited, U.S. PATENT DOCUMENTS, insert
"Schwartzman" should read -- Shwartzman --.

<u>Column 1,</u>
Line 30, "full" should read -- fully --.

<u>Column 2,</u>
Line 36, "quantity" should read -- quantity of --.

<u>Column 6,</u>
Line 30, "any" should read -- any of --.

<u>Column 14,</u>
Line 14, "the" should be deleted; and
Line 19, "ineterior" should read -- interior --.

<u>Column 20,</u>
Line 27, "have," should read -- have --.

<u>Column 24,</u>
Line 4, "alcoholic" should read -- alcohol --; and
Line 47, "Site" should read -- SiGe --.

Signed and Sealed this

Eleventh Day of February, 2003

JAMES E. ROGAN
*Director of the United States Patent and Trademark Office*